(12) United States Patent
Salomie

(10) Patent No.: US 8,466,744 B2
(45) Date of Patent: Jun. 18, 2013

(54) AMPLIFIER AND SIGNAL FILTER

(75) Inventor: Ioan Alexandru Salomie, Kamuela, HI (US)

(73) Assignee: Bryston-OmegaLeap Partners, Peterborough, Ontario (CA)

( * ) Notice: Subject to any disclaimer, the term of this patent is extended or adjusted under 35 U.S.C. 154(b) by 45 days.

(21) Appl. No.: 12/900,347

(22) Filed: Oct. 7, 2010

(65) Prior Publication Data
US 2011/0084764 A1    Apr. 14, 2011

Related U.S. Application Data

(60) Provisional application No. 61/249,989, filed on Oct. 8, 2009.

(51) Int. Cl.
*H03F 3/45* (2006.01)
(52) U.S. Cl.
USPC .................................................... 330/260
(58) Field of Classification Search
USPC .............................................. 330/252–261
See application file for complete search history.

(56) References Cited

U.S. PATENT DOCUMENTS 3,723,896 A * 3/1973 Flickinger .................... 330/255

OTHER PUBLICATIONS

National Semiconductor, High Q Notch Filter, 2 pages, Mar. 1969.
ELEKTOR-USA, 200V Audio Power Amplifier Driver, 1 page, Jul. 24, 2007.
Renardson, The MJR-7 Mosfet Power Amplifier, 5 pages, updated Oct. 11, 2007.
Renardson, A Simple Audio Power Amplifier Design, 6 pages, updated Oct. 28, 2008.
Bryston, 3B-SST Schematic, 2 pages, Oct. 18, 2002.

* cited by examiner

*Primary Examiner* — Robert Pascal
*Assistant Examiner* — Khiem Nguyen
(74) *Attorney, Agent, or Firm* — Jensen & Puntigam, P.S.

(57) ABSTRACT

A signal filter circuit, an amplifier circuit, combinations thereof and methods for configuring and using the same are provided. Embodiments of the amplifier circuit may provide precise reproduction and amplification of input signals. The amplifier may be built entirely with discrete components or an integrated circuit may be configured to provide some or all of the modules included in the amplifier.

25 Claims, 32 Drawing Sheets

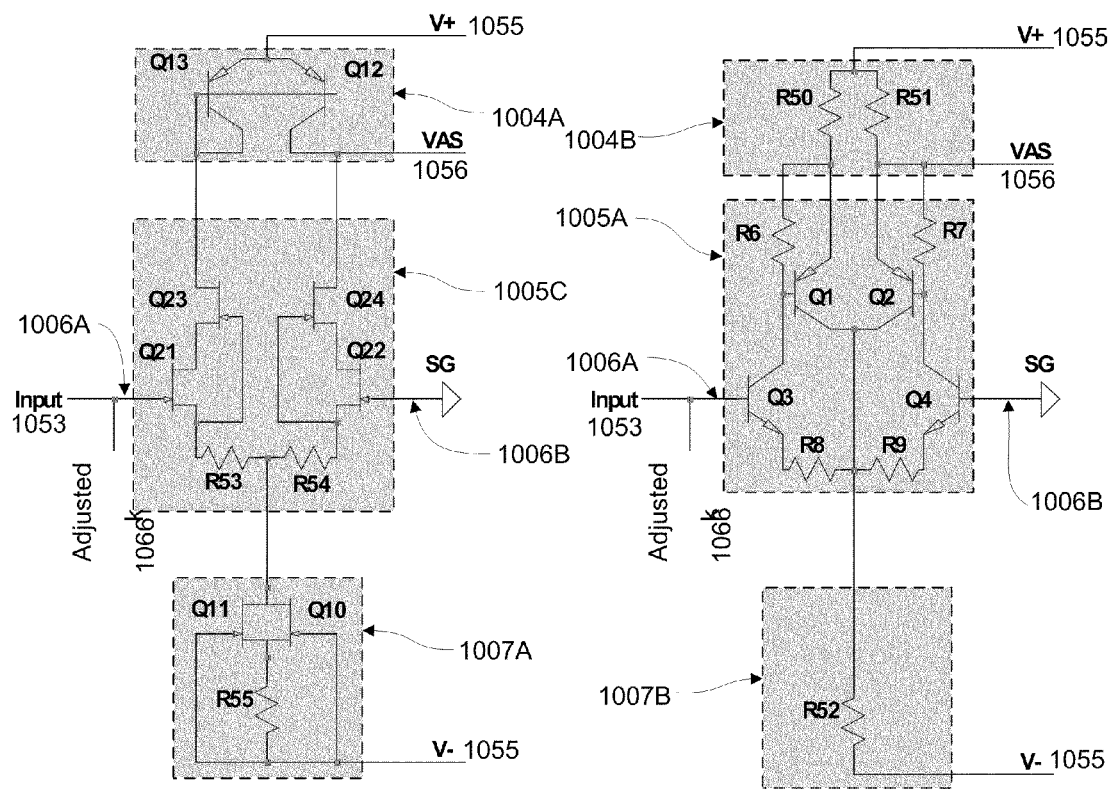
FIG. 14C    FIG. 14D
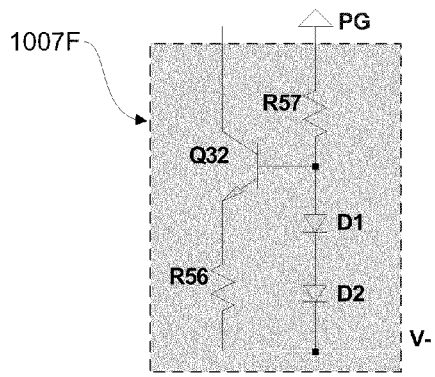
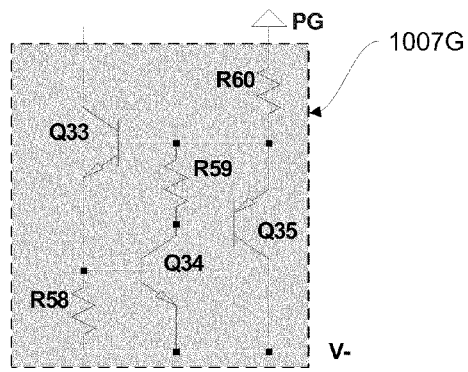
FIG. 15D    FIG. 15E

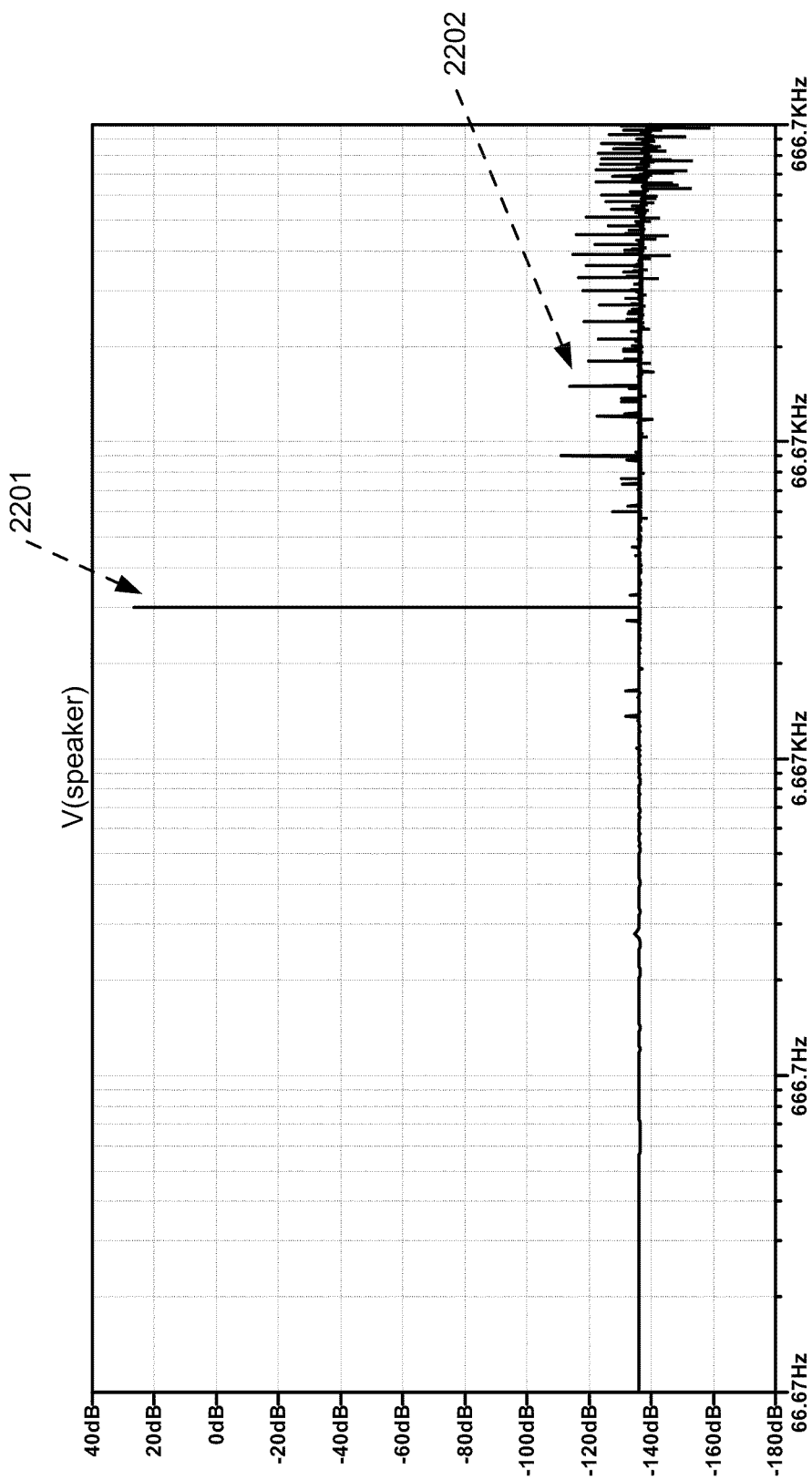

AMPLIFIER AND SIGNAL FILTER

CROSS REFERENCE TO RELATED APPLICATIONS

Priority is claimed to U.S. Provisional Application 61/249,989, filed Oct. 8, 2009, entitled "SIGNAL FILTER AND AMPLIFIER", which is incorporated by reference.

BACKGROUND

A variety of amplifier circuits are known. However, ultra high fidelity and/or performance amplifiers are often quite complex. There is a need for simplified ultra high fidelity and/or performance amplifier architectures. Furthermore, to provide transparent amplification of high resolution input signals there is a demand for amplifier circuits providing high signal to noise ratios. Existing amplifier circuits do not provide signal to noise ratios matching the quality of high resolution input signals.

SUMMARY

A signal filter circuit, an amplifier circuit, combinations thereof and methods for configuring and using the same are provided herein. Embodiments of the amplifier circuit may provide precise reproduction and amplification of input signals, using a schematic that is less complex than many high-performance amplifier schematics. The amplifier may be built entirely with discrete components or an integrated circuit may be configured to provide some or all of the modules included in the amplifier. An amplifier schematic may be simulated in software, and example embodiments provided herein may provide a starting schematic, component types, and component values for simulation and further configuration. Additional aspects and embodiments are described below.

BRIEF DESCRIPTION OF THE DRAWINGS

The foregoing and other features of the present disclosure will become more fully apparent from the accompanying drawings. These drawings depict several embodiments in accordance with the disclosure and are not to be considered limiting of its scope. In the drawings:

FIGS. 14A, 14B, 14C AND 14D are circuit schematic diagrams, each providing example subcomponents of a driver stage;

FIGS. 15A, 15B, 15C, 15D and 15E are circuit schematic diagrams, each providing example subcomponents of a constant current module;

FIG. 22C illustrates a spectrum view of an output signal from an amplifier circuit;

DETAILED DESCRIPTION

Figure 1:
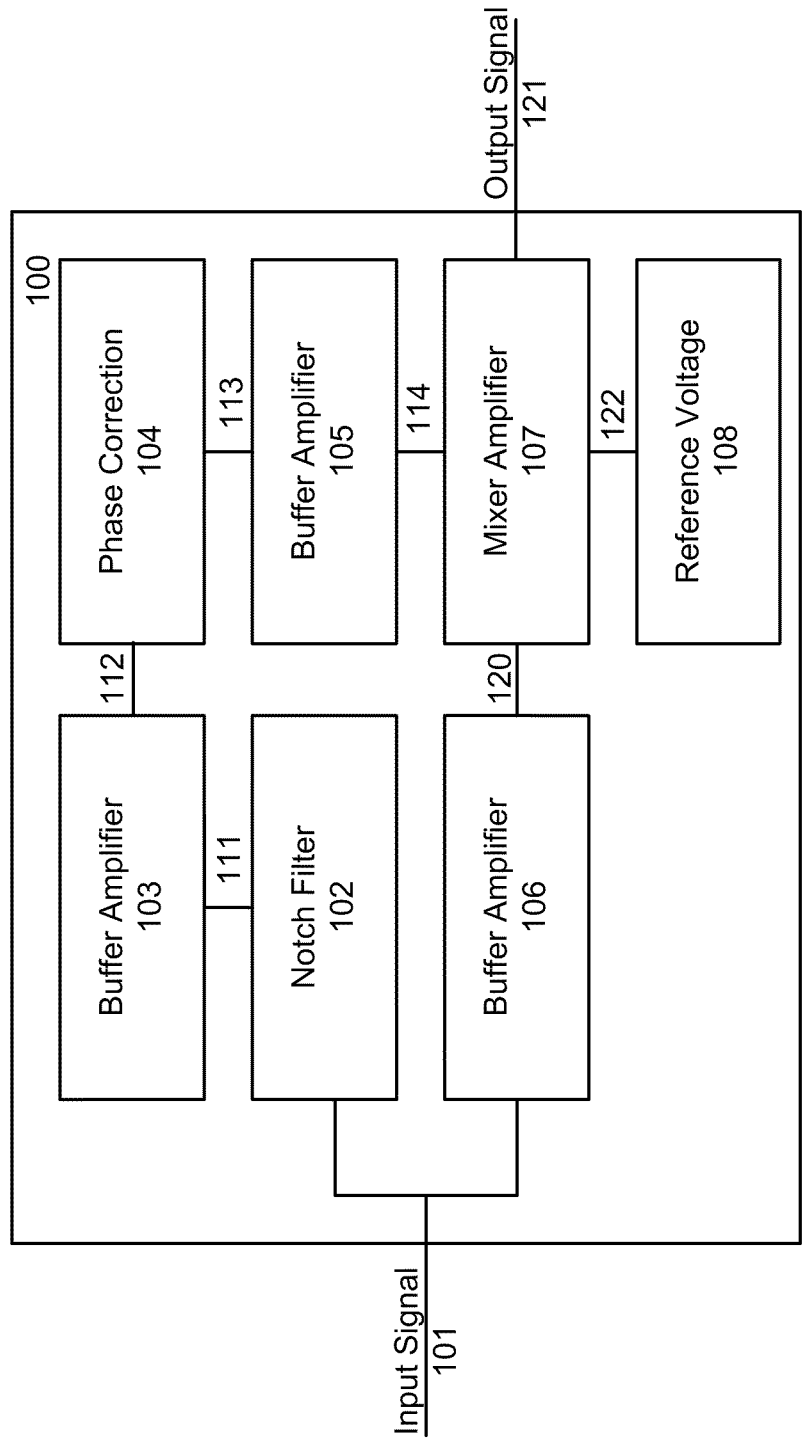
FIG. 1 is a block diagram illustrating example components of a signal filter circuit.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the drawings, may be arranged, substituted, combined, and designed in a wide variety of different configurations, all of which are explicitly contemplated and made part of this disclosure.

FIG. 1 is a block diagram illustrating an example signal filter circuit 100. Signal filter circuit 100 may perform selective signal restoration. Circuit 100 may comprise a plurality of modules including, for example, a notch filter 102, a buffer amplifier 103, a phase correction module 104, a buffer amplifier 105, a buffer amplifier 106, a mixer amplifier 107, and a reference voltage 108. Each of the modules may be configured according to a module schematic as discussed herein. Furthermore, each of the modules may comprise one or more components such as resistors, capacitors, transistors, integrated circuits, and various other electronic components discussed herein or as may be apparent to those of skill in the art in light of this disclosure. In general, a circuit according to FIG. 1 may remove distortion components from an input signal to produce a "clean" output signal, as described below.

In FIG. 1, an input signal 101, comprising a main component with some distortion, may be introduced to the notch filter 102 and the buffer amplifier 106. The main component may comprise, for example, a constant frequency sinusoidal waveform, such as main component 201 in FIG. 2. The notch filter 102 filters the input signal 101 to produce a filtered signal 111 that reduces the amplitude of the main component 201. Buffer amplifier 103 may then amplify the filtered signal, producing amplified filtered signal 112. Phase correction module 104 may then adjust the amplified filtered signal to produce a restored signal 113, with a same or opposite phase as the input signal 101. Buffer amplifier 105 may then amplify the restored signal 113, producing amplified restored signal 114. Mixer amplifier 107 produces output signal 121 by performing an operation with the amplified restored signal 114 and the output 120 of the buffer amplifier 106. Mixer amplifier 107 may utilize reference voltage signal 122 from reference voltage module 108 to cancel any residual Direct Current (DC) voltage component from the output signal 121.

Figure 2:
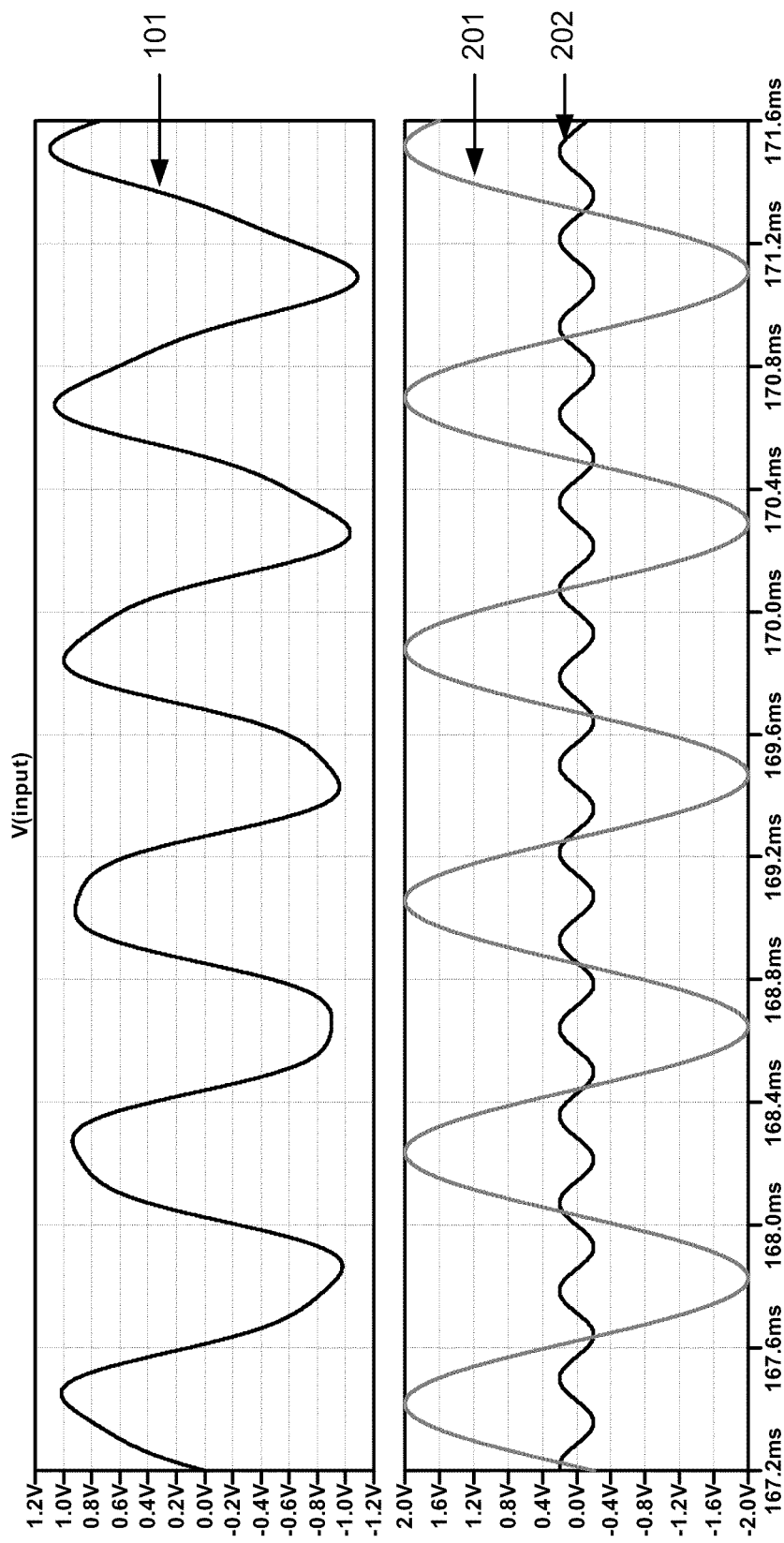
FIG. 2 illustrates an input signal and a main component and distortion components of the input signal.

A circuit 100 allows for creating an output signal 121 which is a "cleaner" version of a main component 201 (as illustrated in FIG. 2) of the input signal 101, by removing distortion components 202 with different frequencies from the input signal 101. The circuit 100 may isolate distortion component(s) 202 of input signal 101, and remove the distortion component(s) 202 from the input signal 101, to produce an output signal 121.

The circuit 100 may comprise an isolation stage, a processing stage, and a removal stage. In embodiments according to FIG. 1, the isolation stage comprises a notch filter 102, the processing stage comprises the phase correction module 104 and one or more buffer amplifiers such as 105, and the removal stage comprises a mixer amplifier 107 and voltage reference 108. However, other embodiments may be configured differently. For example, the notch filter 102 may be replaced by other means for isolating distortion component(s), such as an appropriately configured set of coils and filters, in some embodiments. The processing stage may be configured to produce isolated distortion component(s) which are in-phase with the distortion component(s) 202 of the input signal 101, or which are in opposite phase from the distortion component(s) 202 of the input signal 101. The mixer amplifier 107 may be configured as differential amplifier when the distortion component(s) produced by the processing stage are in-phase with the distortion component(s) 202 of the input signal 101; however the mixer amplifier 107 may be configured as a summing amplifier when the distortion component(s) produced by the processing stage are in opposite phase from the distortion component(s) 202 of the input signal 101.

In FIG. 1, the isolation stage, processing stage, and removal stage are directly coupled using wire connections. However, the stages may be coupled inductively or otherwise wirelessly in some embodiments. It will be appreciated that such possible variations in connections/couplings may apply to all of the connections/couplings herein.

Figure 3:
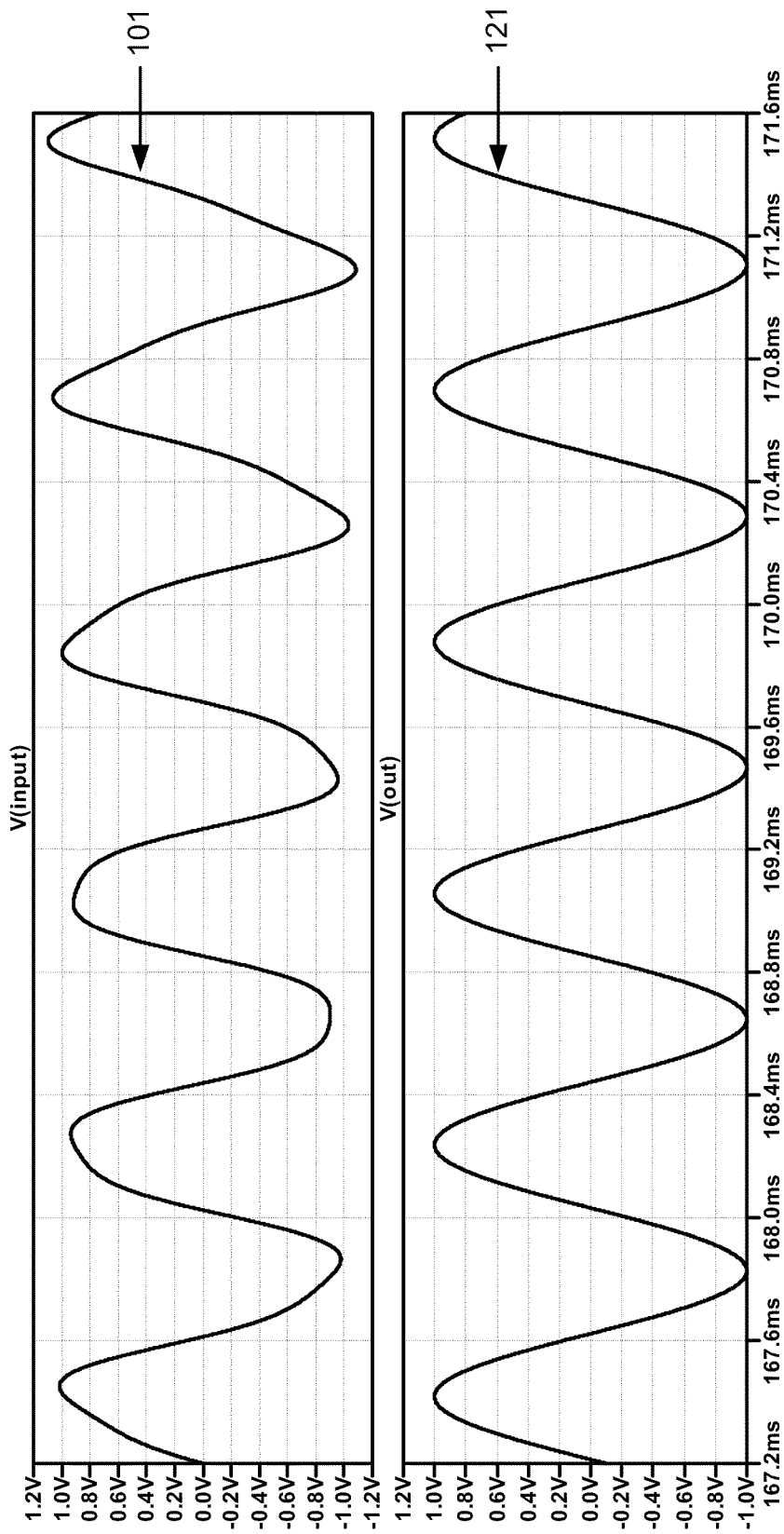
FIG. 3 illustrates an example input signal and an output signal comprising a filtered version of the input signal.

For example, FIG. 2 illustrates a main component 201 and a distortion component 202. The combination of signals 201 and 202 may produce an input signal such as 101, also labeled as V(input). FIG. 3 illustrates an example input signal 101 comprising a combination of signals 201 and 202 from FIG. 2. A circuit 100 may be used to extract an output signal 121 (also labeled V(out)) from the input signal 101. Output signal 121 is a filtered version of the input signal 101, comprising the main component 201 of the input signal 101.

Figure 4:
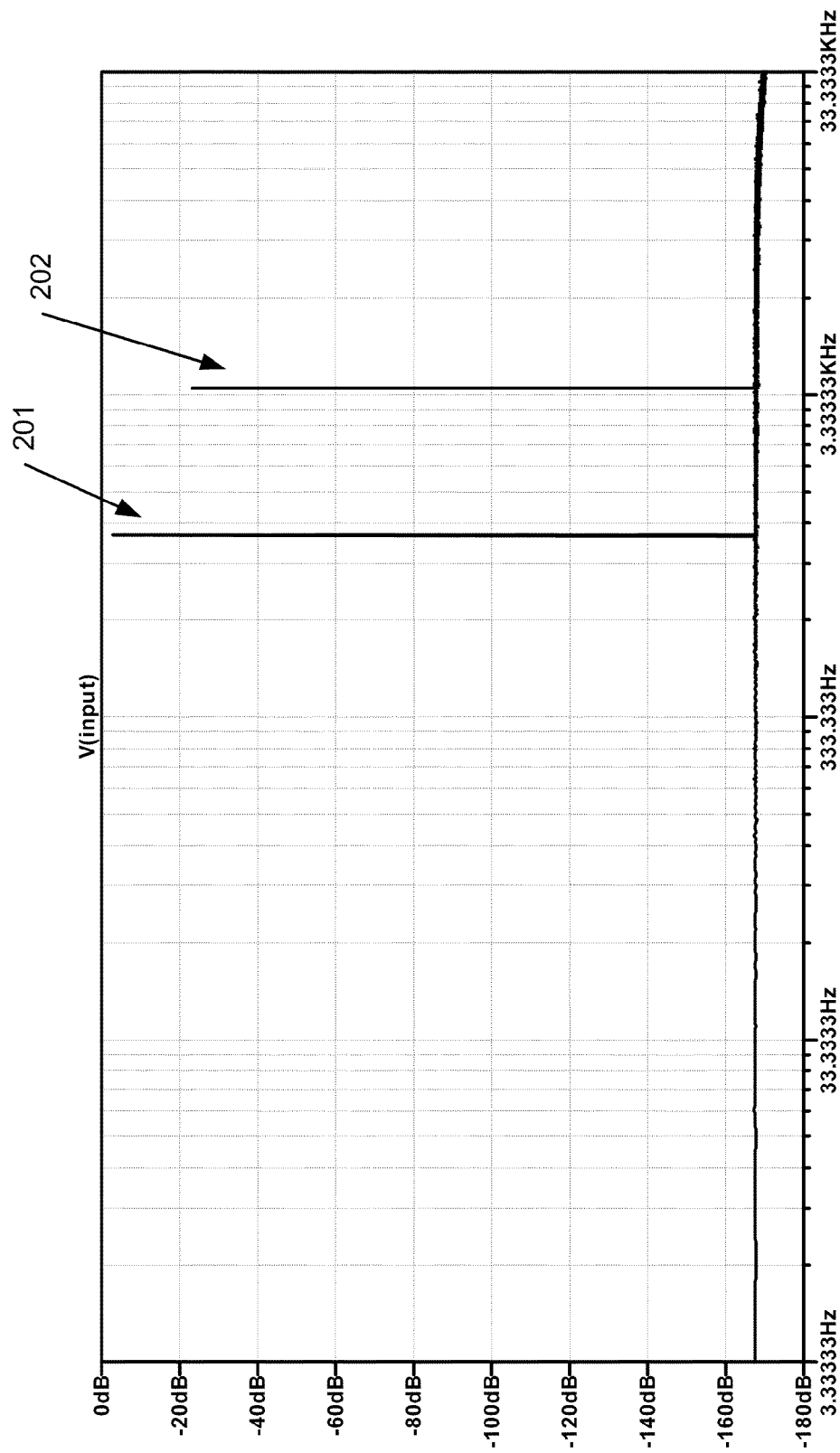
FIG. 4 illustrates a spectrum view of an example input signal.
Figure 5:
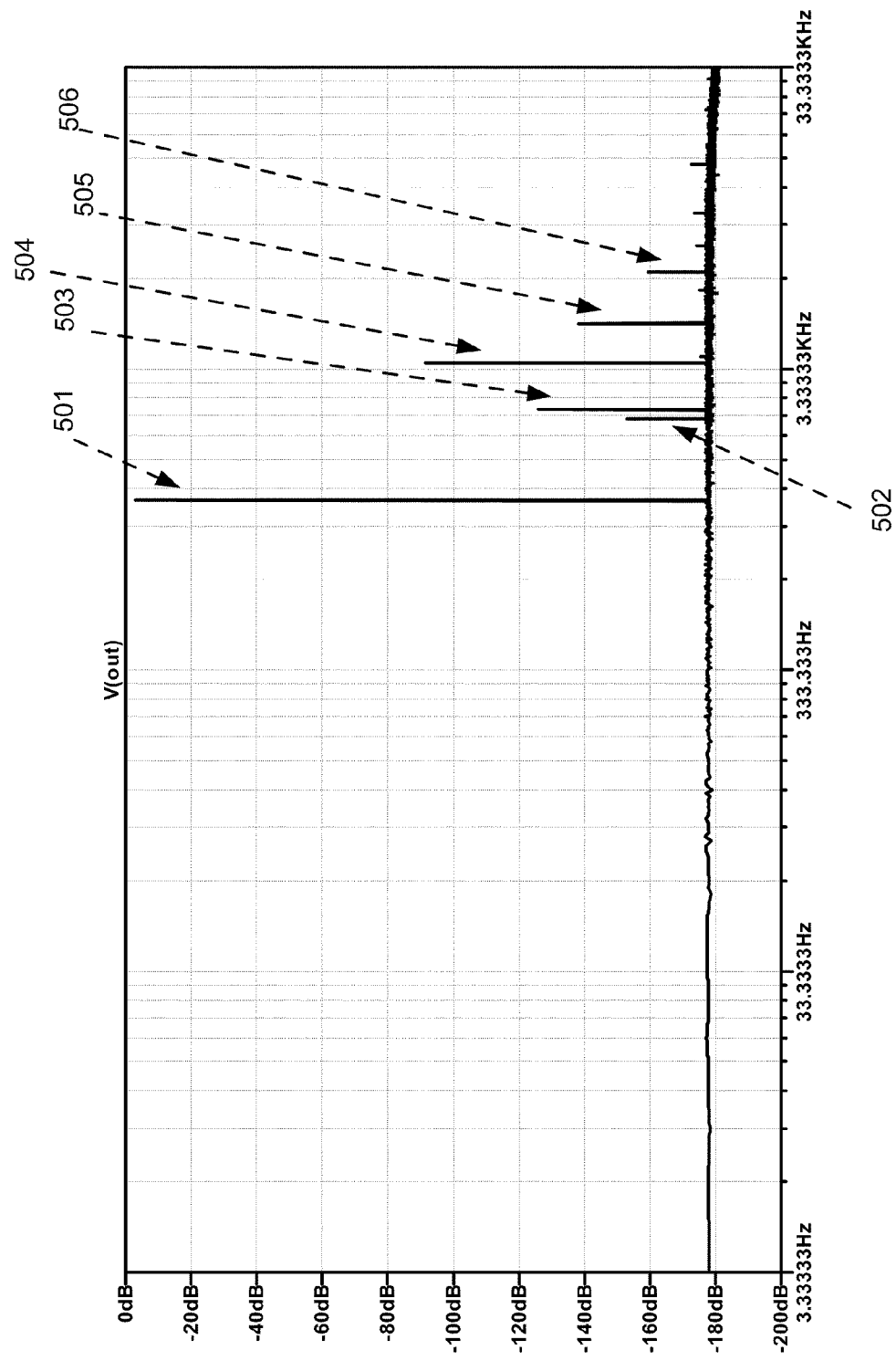
FIG. 5 illustrates a spectrum view of an example main component and distortion components of an output signal.

FIG. 4 illustrates a spectrum view of an example input signal corresponding to input signal 101. FIG. 4 shows a spectrum view of main component 201 and distortion component 202 illustrated in FIG. 2. FIG. 5 shows a spectrum view of an example output signal corresponding to output signal 121. FIG. 5 shows a spectrum view of an example main component 501 of output signal 121 and distortion components 502-506 of output signal 121. Comparing FIG. 4 and FIG. 5, it can be seen that the main component 501 has a same frequency as main component 201 from FIG. 4, and the distortion components 502-506 are greatly diminished in an output signal such as shown in FIG. 5 as compared with a distortion component in an input signal such as FIG. 4.

It can be seen from FIG. 5 that while the magnitude of distortion is diminished, additional distortion frequencies may be introduced. In other words, FIG. 5 includes 6 or more separate distortion components while the input signal profiled in FIG. 4 includes only one distortion component. The additional distortion components shown in FIG. 5 may be caused by the various modules illustrated in FIG. 1. Techniques for minimizing the extent of additional distortion components may be employed in connection with the embodiments disclosed herein. Such techniques may include designing a circuit comprising a plurality of modules, at least some of the modules according to FIG. 1. Processes for designing a circuit according to FIG. 1, may comprise selecting component types and component values for various modules described herein. For example, a variety of resistor, capacitor, and integrated circuit types are available. Modules and component types may be selected for a variety of operating environments, for example, if temperature variations are expected, components with high stability over a range of temperatures may be selected. Also, components may be selected for low noise and low distortion in some embodiments.

Figure 6:
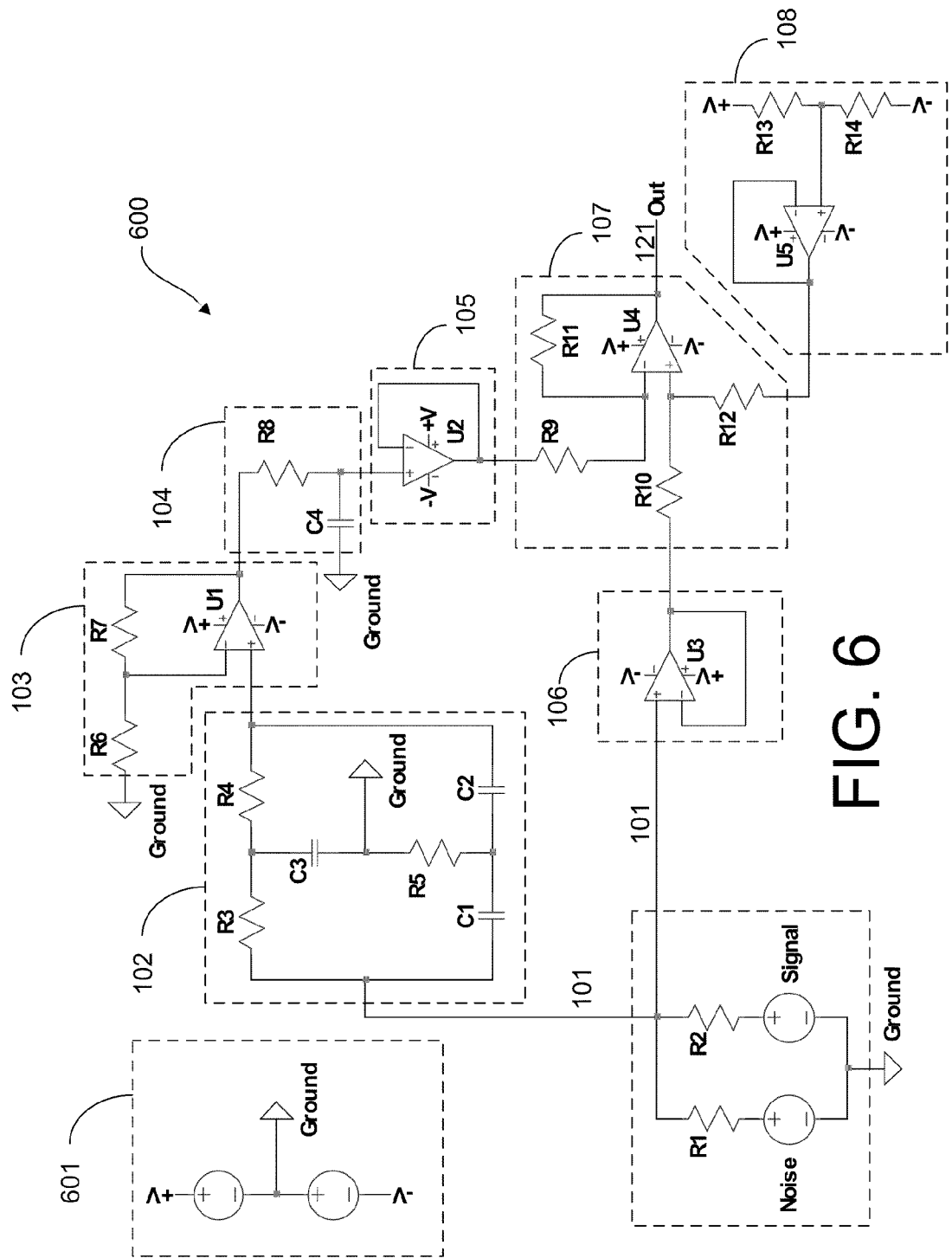
FIG. 6 is a circuit schematic diagram illustrating an example circuit according to the general design provided in FIG. 1.

FIG. 6 is a circuit schematic diagram illustrating an example circuit 600 according to the general design provided in FIG. 1. Modules of the circuit schematic in FIG. 6 corresponding to modules illustrated in FIG. 1 are indicated using boxes with dashed borders and identifiers corresponding to FIG. 1. Input signal 101 and output signal 121 are also shown in FIG. 6. A power supply 601 is also shown. In FIG. 6, example input signal 101 is obtained by mixing a main component (signal passing through R2 in FIG. 6) with a distortion component (noise passing through R1 in FIG. 6). Mixer amplifier 106 is illustrated as a differential amplifier in FIG. 6.

Figure 7:
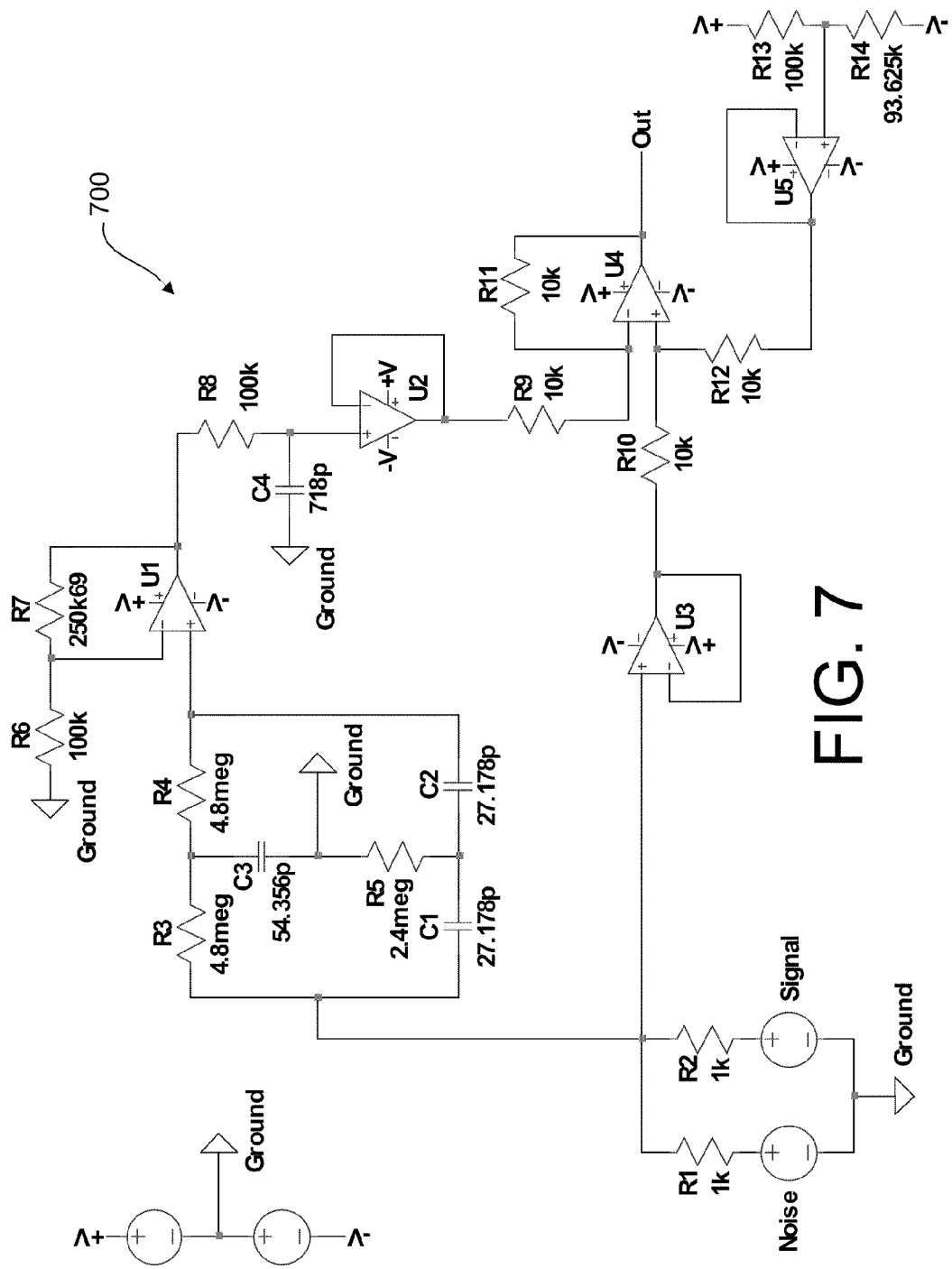
FIG. 7 is a circuit schematic diagram illustrating an example circuit according to the schematic of FIG. 6.

FIG. 7 is a circuit schematic for an example circuit 700 according to the schematic of FIG. 6, in which detailed values are provided for the various elements of the schematic. The detailed values of FIG. 7 are provided as examples only and a wide range of other values may be used.

Figure 8:
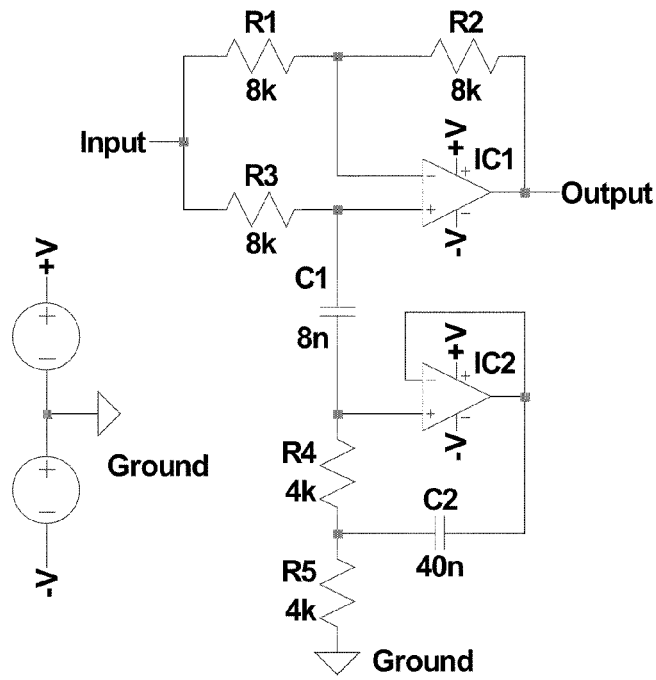
FIG. 8 is a circuit schematic diagram illustrating an example notch filter.
Figure 9:
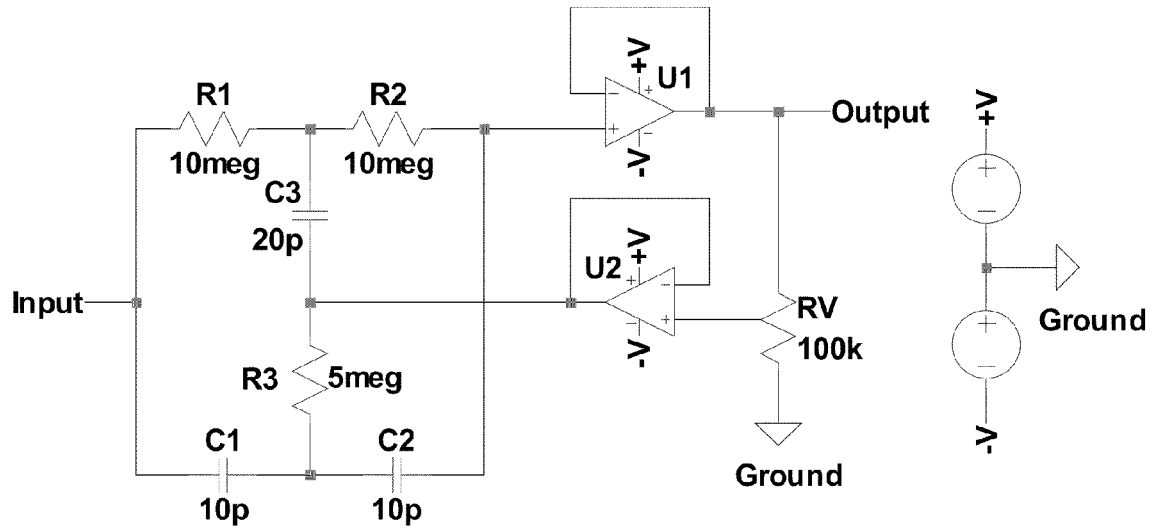
FIG. 9 is a circuit schematic diagram illustrating an example notch filter.

A circuit such as 700 may be optimized for particular input signal 101 frequencies. For example the values of the various components of the notch filter 102 may be selected to match a main component of an input signal 101. In FIG. 7, the notch filter 102 is designed for an input signal frequency of 1220 Hz. FIGS. 8 and 9 and corresponding description, below, explain how notch filter 102 values may be selected in some embodiments.

Once notch filter 102 component values are selected, values of various other components of a circuit 700 may be selected based on the notch filter 102 values, and also optionally based on an identified frequency of a distortion component 202 of the input signal 101.

Components R6 and R7 form a portion of a buffer amplifier 103 which may also include integrated circuit U1 and/or equivalent components. R6 and R7 determine the gain of the buffer amplifier 103. R6 and R7 may be combined into a single variable resistor in some embodiments. In general the higher the ratio of R7 to R6, the larger the gain of the buffer amplifier 103 is. Buffer amplifier 103 gain may compensate for input signal voltage loss due to the notch filter 102. Buffer amplifier 103 may output a signal 112 which may be an amplified version of signal 111.

Figure 10:
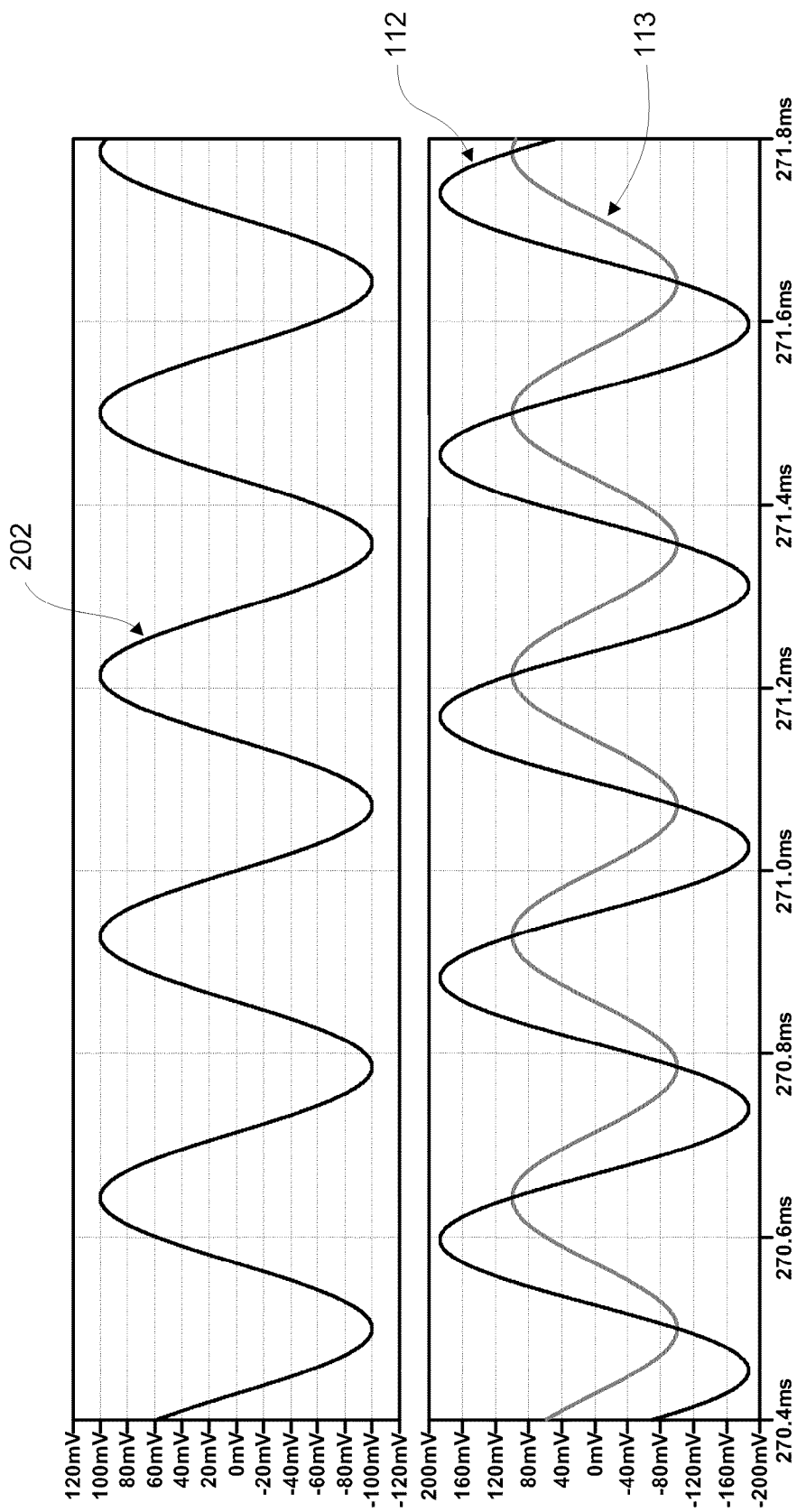
FIG. 10 illustrates relative phases of various example signals.

Components R8 and C4 are components of an example phase correction module 104. Phase correction module 104 may be configured to produce a phase shift in a distortion component of signal 112 coming from the buffer amplifier 103, so that the phase of the distortion component in restored signal 113 output from the phase correction module 104 is the same as the phase of the distortion component 202 of the input signal 101. FIG. 10 illustrates relative phases of example signals 202, 112, and 113. The phase correction module 104 may convert signal 112 into signal 113. Signal 113 is in phase with signal 202, as shown. In other embodiments, the phase correction module 104 may convert signal 112 into a signal 113 which is in opposite phase with signal 202.

Figure 11:
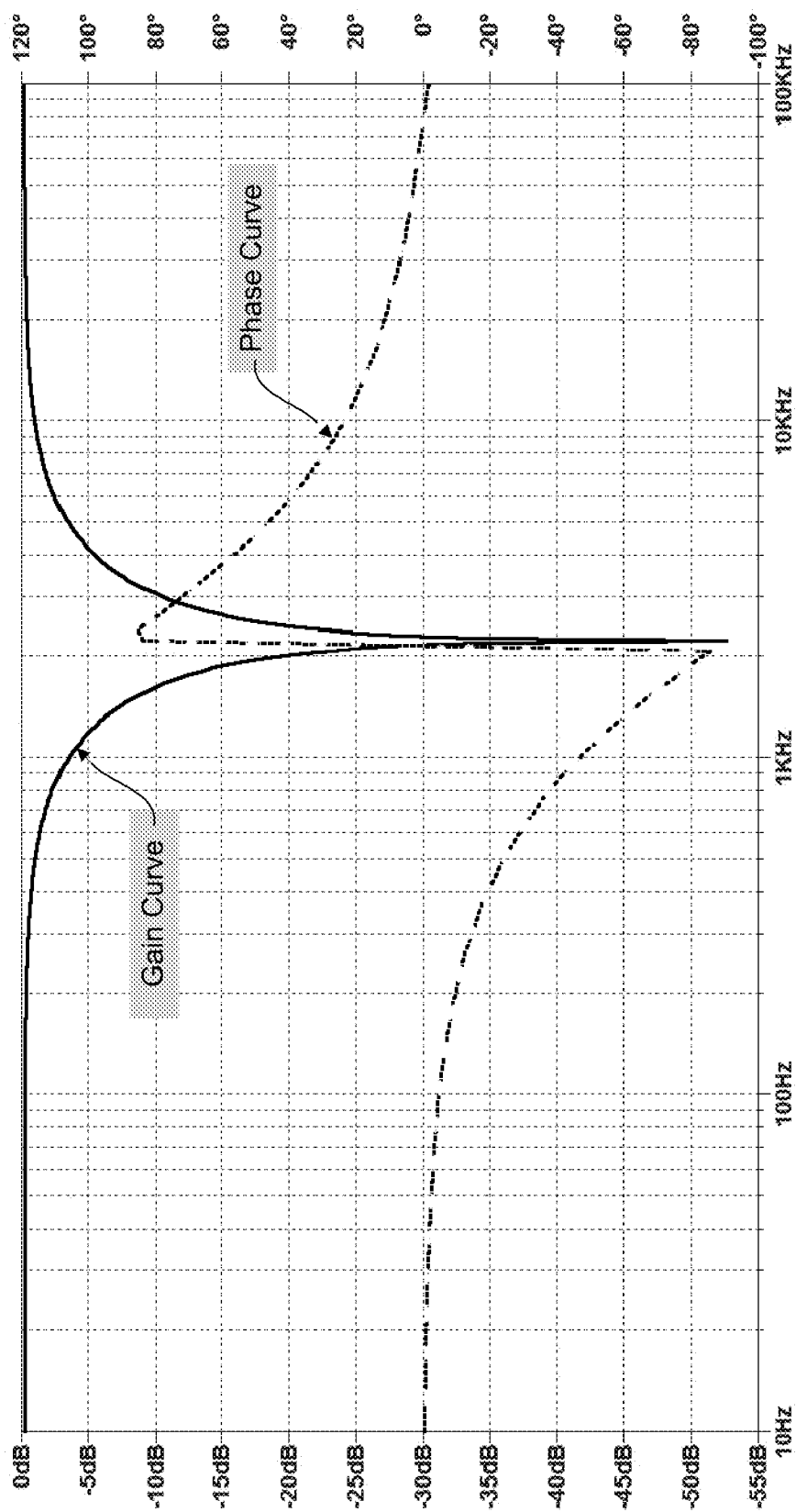
FIG. 11 illustrates the effect of a notch filter on input signals of various frequencies.

The specific circuit 700 may comprise values for R8 and C4 configured for a specific distortion component 202 frequency of input signal 101. Here, the values of R8 and C4 are configured for a distortion component frequency of 3500 Hz. Distortion component frequency may for example be measured with a spectrum analyzer, e.g., as shown in FIG. 4. In some embodiments, distortion component frequencies may be measured by spectrum analysis of an input signal 101. Once a distortion component frequency is known, values for components R8 and C4 may be selected accordingly, for example based on a phase shift that may be determined according to FIG. 11. With reference to FIG. 11, a process may be performed comprising identifying a distortion component 202 frequency, using the identified distortion component 202 frequency to determine a phase shift from a phase curve, and compensating for the phase shift by adjusting values of one or more components (e.g., R8 and C4) in a circuit such as FIG. 1.

FIG. 11 illustrates the effect of a notch filter on input signals of various frequencies. The gain curve shows that at a selected frequency (such as 1220 Hz in the illustrated example, which may correspond to a main component 201), signal gain drops precipitously. Otherwise, gain is relatively constant across other frequencies, with some gain drop in the band around the selected frequency. Therefore, with reference to FIG. 11, a process may be performed comprising identifying a distortion component 202 frequency, using the identified distortion component 202 frequency to determine a gain drop from a gain curve, and compensating for the gain drop by adjusting the gain of one or more buffer amplifier(s) in a circuit such as FIG. 1.

The phase curve shows that the notch filter produces a 180 degree phase shift of signals at the selected frequency. The phase shift is related to the gain drop. As a result, the phase shift is more significant in a band around a selected frequency, and the phase shift drops as signal frequency increases above or decreases below the selected frequency. The phase correction module 104 may be configured to cancel the illustrated phase shift for distortion component signals of lower or higher frequency than the selected frequency, as described above.

Referring back to FIG. 7, components U2 and U3 are components of buffer amplifiers 105 and 106, respectively. In circuit 700, the gains at U2 and U3 may be unitary (i.e., no gain), and U2 and U3 may be non-inverting amplifiers. However, as stated above, other gain values and/or inverting amplifiers may be used in specific embodiments.

Where buffer amplifiers 103, 105, and 106 are non-inverting, a differential amplifier may be used at 107, as shown in FIG. 1. This achieves a cancelation of the distortion components of signals 120 and 114 entering the mixer amplifier 107. However, in some embodiments, any of amplifiers 103, 105, and 106 may be configured as inverting amplifiers. If any one of amplifiers 103, 105, and 106 is configured as an inverting amplifier, mixer amplifier 107 may be configured as a summing amplifier in order to achieve cancelation of distortion components. Other combinations of inverting and non-inverting amplifiers, and differential and summing amplifiers which also achieve cancelation of distortion components are possible in particular embodiments.

Components R9-R12 and U4 are components of mixer amplifier 107 configured as differential amplifier. In circuit 700, R9 and R10 have identical values, and R11 and R12 have identical values. The gain of the mixer amplifier 107 is determined by the ratio of R11 to R9. Mixer amplifier 107 outputs the difference of input signals 114 and 120. Here, the ratios of R11 to R9 is one, corresponding to a unitary gain. Other embodiments may apply a gain by changing the ratio of R11 to R9.

Component R12 in circuit 700 is coupled to an adjustable reference voltage module 108. Values of the various components associated with adjustable reference voltage module 108 may be modified to produce a desired DC reference voltage. The DC reference voltage can then be used by mixer amplifier 107 to cancel a DC voltage component from output signal 121. In some embodiments, U5 can be replaced by a dedicated adjustable reference voltage integrated circuit.

FIGS. 8 and 9 are circuit schematic diagrams illustrating example notch filters as may be used in some embodiments. In general, a notch filter may comprise a filter that passes all frequencies except those in a stop-band centered on a center frequency. It should be noted that the specific values provided in FIGS. 8 and 9 are examples only and the disclosure is not limited to the illustrated values.

In FIG. 8 the relationship between the resistors R1 to R5 and the formula for computing the center frequency F of the stop-band is given in the equation below. The value of resistor R3 changes the attenuation and the quality Q of the filter. Optimally the value of R3 is equal to the value of R1.

$$R_1 = R_2, \quad R_4 = R_5, \quad R_4 = \frac{1}{2}R_1$$

$$F = \frac{1}{2\pi R_4 \sqrt{C_1 C_2}}$$

In FIG. 9 the relationship between the resistors R1 to R3 and the capacitors C1 to C3, and the formula for computing the center frequency F of the stop-band, is given in the equation below. The value of variable resistor RV changes the attenuation and the quality Q of the filter.

$$R_1 = R_2, \quad R_3 = \frac{1}{2}R_1$$

$$C_1 = C_2, \quad C_3 = 2C_1$$

$$F = \frac{1}{2\pi R_1 C_1}$$

In some embodiments, a signal filter circuit 100 as described herein may be used as a signal source for an amplifier circuit, for example, an amplifier circuit as described herein. The signal filter circuit 100 may provide a low-distortion signal source that can be used to test, configure, and optimize the amplifier circuit.

Figure 12:
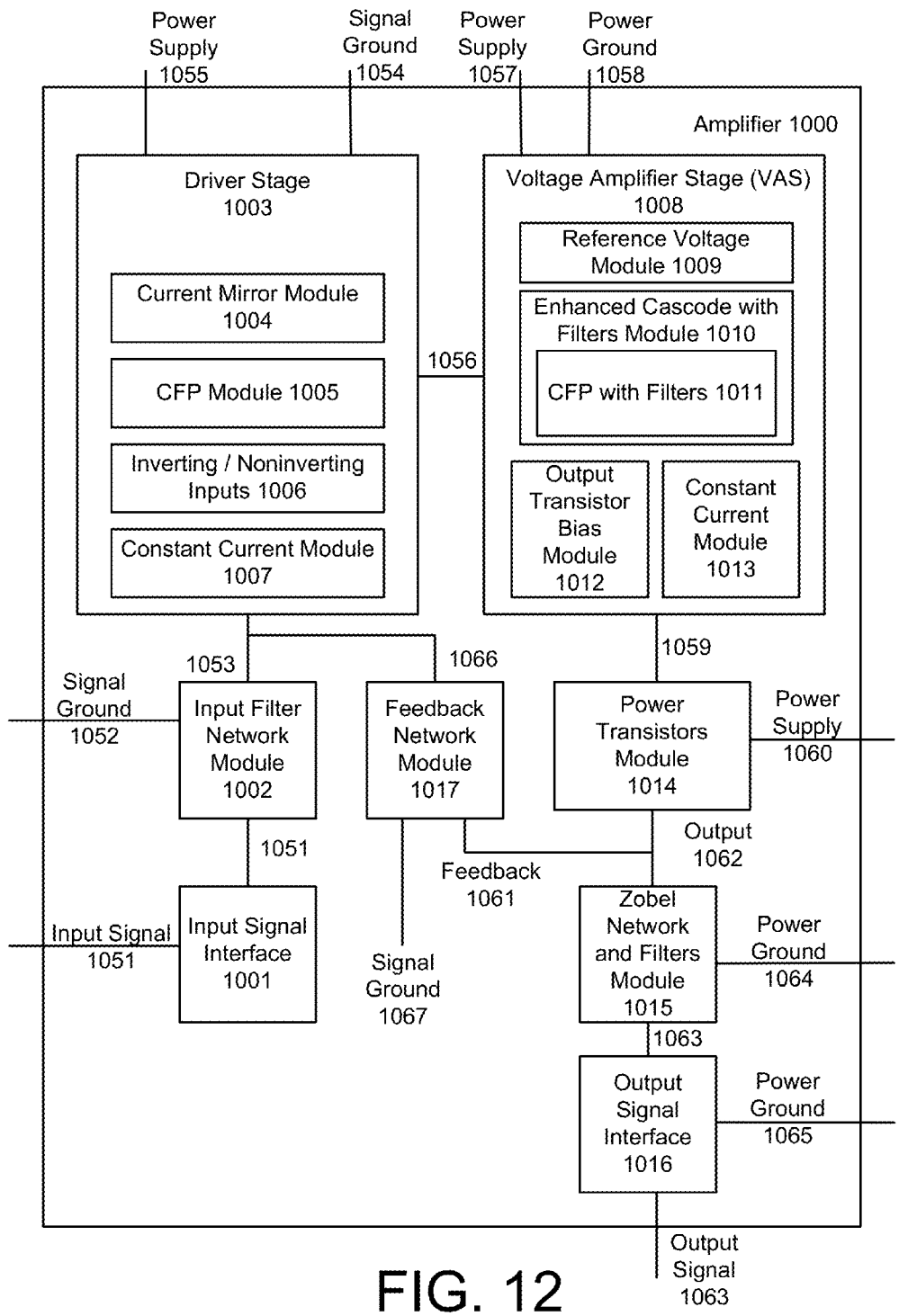
FIG. 12 is a block diagram illustrating an example amplifier circuit.

FIG. 12 is a block diagram illustrating an example amplifier circuit 1000. Amplifier circuit 1000 may for example comprise a plurality of modules including, for example, an input signal interface 1001, an input filter network module 1002, a driver stage 1003, a VAS 1008, a power transistors module 1014, a zobel network and filters module 1015, an output signal interface 1016, and a feedback network module 1017. It will be appreciated by those of skill in the art that each of the driver stage 1003, the VAS 1008 and the power transistors module 1014 are examples of amplification stages, and therefore these elements may be referred to generally herein as amplification stages. The term "driver stage" as used herein refers to an amplification stage which may also be understood as an input stage. Furthermore, it can be seen in FIG. 12 and FIG. 18 that each amplification stage 1003, 1008, and 1014 comprises at least one Complementary Feedback Pair (CFP), namely CFP module 1005, CFP with filters 1011, and the first and second CFP described below with reference to FIG. 18, respectively. In some embodiments an input filter network module 1002 may comprise two input filter networks, such as, a first input filter network and a second input filter network. Furthermore, a feedback network module 1017 may comprise two feedback networks, such as, a first feedback network and a second feedback network, as disclosed herein. In some embodiments an output signal interface 1016 may comprise a speaker interface.

Driver stage 1003 may for example comprise a current mirror module 1004, CFP module 1005, inverting and non-inverting inputs 1006, and constant current module 1007. VAS 1008 may comprise a reference voltage module 1009, enhanced cascode module with filters module 1010, CFP with filters 1011, output transistor bias module 1012, and constant current module 1013. As with FIG. 1, each of the modules may be configured according to a module schematic as discussed herein. Furthermore, each of the modules may comprise one or more components such as resistors, capacitors, transistors, integrated circuits, and various other electronic components discussed herein or as may be apparent to those of skill in the art in light of this disclosure.

In FIG. 12, input signal 1051 may enter the amplifier 1000 at the input signal interface 1001. Input signal interface 1001 may pass input signals 1051, such as, analog balanced or unbalanced, and digital signals, to the input filter network module 1002. Input filter network module 1002 may also be connected to a constant reference voltage, such as, signal ground 1052. Input filter network module 1002 may output a filtered signal 1053 with removed Direct Current (DC) voltage component. Filtered signal 1053 may be input to the driver stage 1003. Driver stage 1003 may also be connected to a constant reference voltage, such as, signal ground 1054 and power supply 1055. Driver stage 1003 may output an amplified and distortion compensated signal 1056. Amplified and distortion compensated signal 1056 may be input to the VAS 1008. VAS 1008 may also be connected to a power supply 1057 and a constant reference voltage, such as, power ground (PG) 1058. VAS 1008 may output an amplified signal 1059. A VAS output may be connectable to one or more of a power transistors module 1014, a zobel network and filters module 1015, and an output signal interface 1016. In the illustrated embodiment, signal 1059 may be input to the power transistors module 1014. Power transistors module 1014 may also be connected to a power supply 1060. Power transistors module 1014 may output a signal 1062 to the zobel network and filters module 1015, and a signal 1061 to a feedback network module 1017. Feedback network module 1017 may also be connected to a constant reference voltage, such as, signal ground 1067. Feedback network module 1017 further passes the adjusted feedback signal 1066 to the driver stage 1003. Zobel network and filters module 1015 may output signal 1063 to output signal interface 1016. Zobel network and filters module 1015 may also be connected to a constant reference voltage, such as, power ground (PG) 1064. Also output signal interface 1016 may be connected to a constant reference voltage, such as, power ground (PG) 1065. An output signal interface 1016 may comprise a speaker protection module (not shown). A speaker may be connected to the output signal interface 1016 to convert the output thereof to sound.

In some embodiments, input filter network module 1002 may comprise a high-pass filter and a low pass filter. The high pass filter may be configured to block DC (0 Hz) signal components, while allowing other frequencies to pass with low or no attenuation. The low pass filter may be configured to allow lower frequency ranges to pass but attenuates certain high-range frequencies. The combination of the high and low pass filters forms a band pass filter with a bandwidth which attenuates all frequencies outside a desired frequency range for the amplifier. The desired frequency response of the amplifier, i.e. the gain and phase of the output signal, may be configured for example by selecting component values for the high and low pass filters. The frequency response of an amplifier designed according to the block diagram of FIG. 12 may also be affected by component values corresponding to any of the various modules described herein.

In some embodiments, amplifier 1000 may be configured to produce an output signal 1063 which is an amplified version of an input signal 1051, with low distortion. Low distortion may be achieved via a variety of the modules, their components and configuration aspects of amplifiers according to FIG. 12, examples and aspects of which are discussed in further detail below.

In some embodiments, an amplifier 1000 may be configured for constant gain within a large bandwidth and enhanced amplification linearity. Amplifier 1000 may also be unconditionally stable, as will be appreciated from the various examples and data provided herein—for example, see the simulation of gain and phase difference illustrated in FIG. 21, which may be achieved by some embodiments of the amplifier. The term "unconditional stability" is a technical term understood by those of skill in the art which refers to the ability of a circuit to not self-oscillate or otherwise misbehave when amplifying a signal. A large bandwidth may for example comprise a bandwidth that is about 100 kHz wide or wider. For example, a bandwidth from 10 Hz-100 kHz is considered to be a large bandwidth. An enhanced amplification linearity may comprise amplification linearity that is higher than what would be otherwise achieved without the use of the various components described herein as enhancing amplification linearity. Constant gain within a large bandwidth and enhanced amplification linearity may result in low distortion of the output signal, such as, 1062. A combination of an enhanced cascode module comprising a CFP module, as described herein in connection with some embodiments, may contribute to producing constant gain within a large bandwidth and enhanced amplification linearity. Furthermore, the use of a CFP module in a driver stage may also contribute to producing constant gain within a large bandwidth and enhanced amplification linearity in some embodiments. The use of a CFP module (or CFP configuration, as described herein) in place of a transistor may also contribute to producing constant gain within a large bandwidth, and increasing amplification linearity. FIG. 13, FIG. 23, FIG. 24, and FIG. 28 provide examples in which a CFP module 1005 comprising two CFP configurations is used in a driver stage, and a CFP module with filters 1011 is also embedded in an enhanced cascode module with filters module 1010. In general, any transistor component illustrated herein may be replaced by a CFP as appropriate, as will be appreciated by those of skill in the art.

Figure 13:
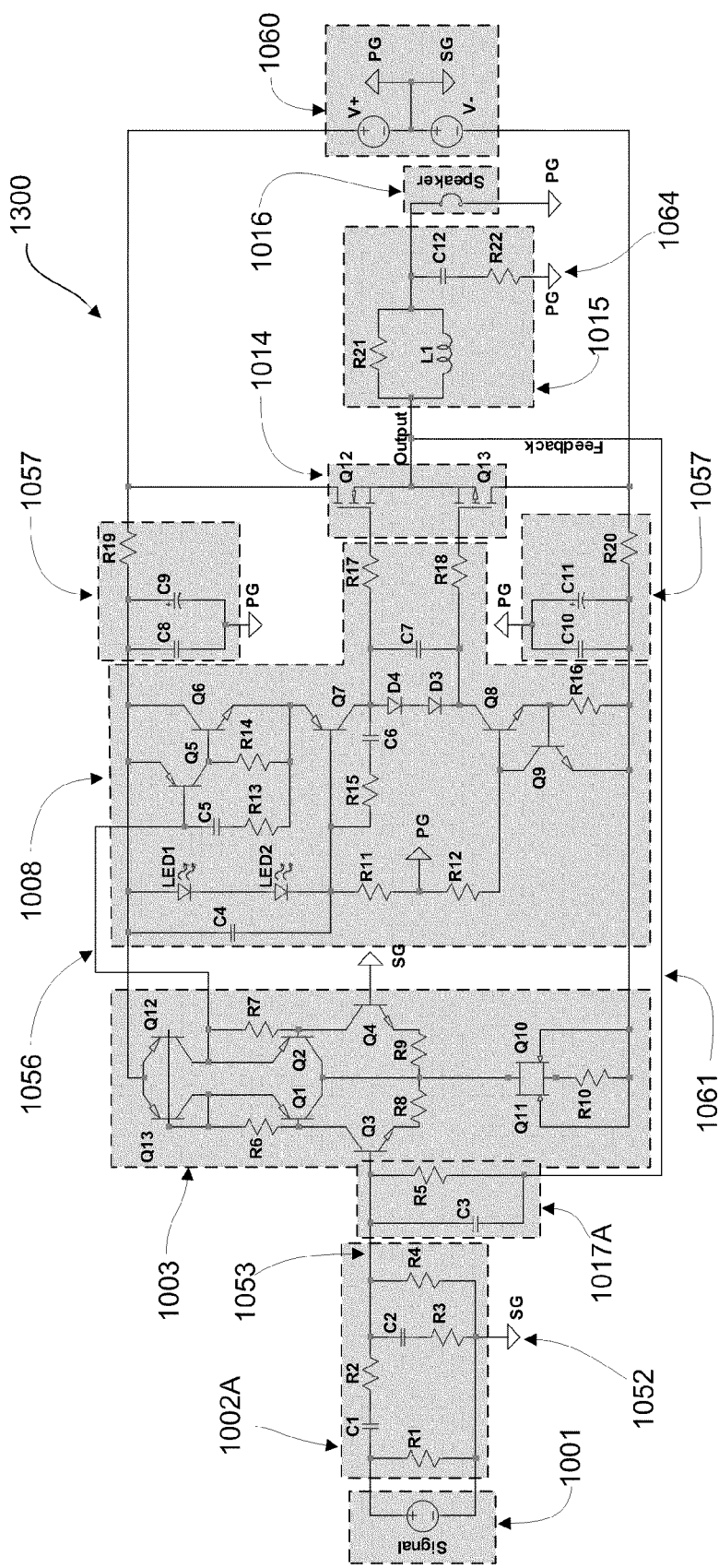
FIG. 13 is a circuit schematic diagram illustrating an example detailed amplifier circuit with unbalanced input filter network.
Figure 23:
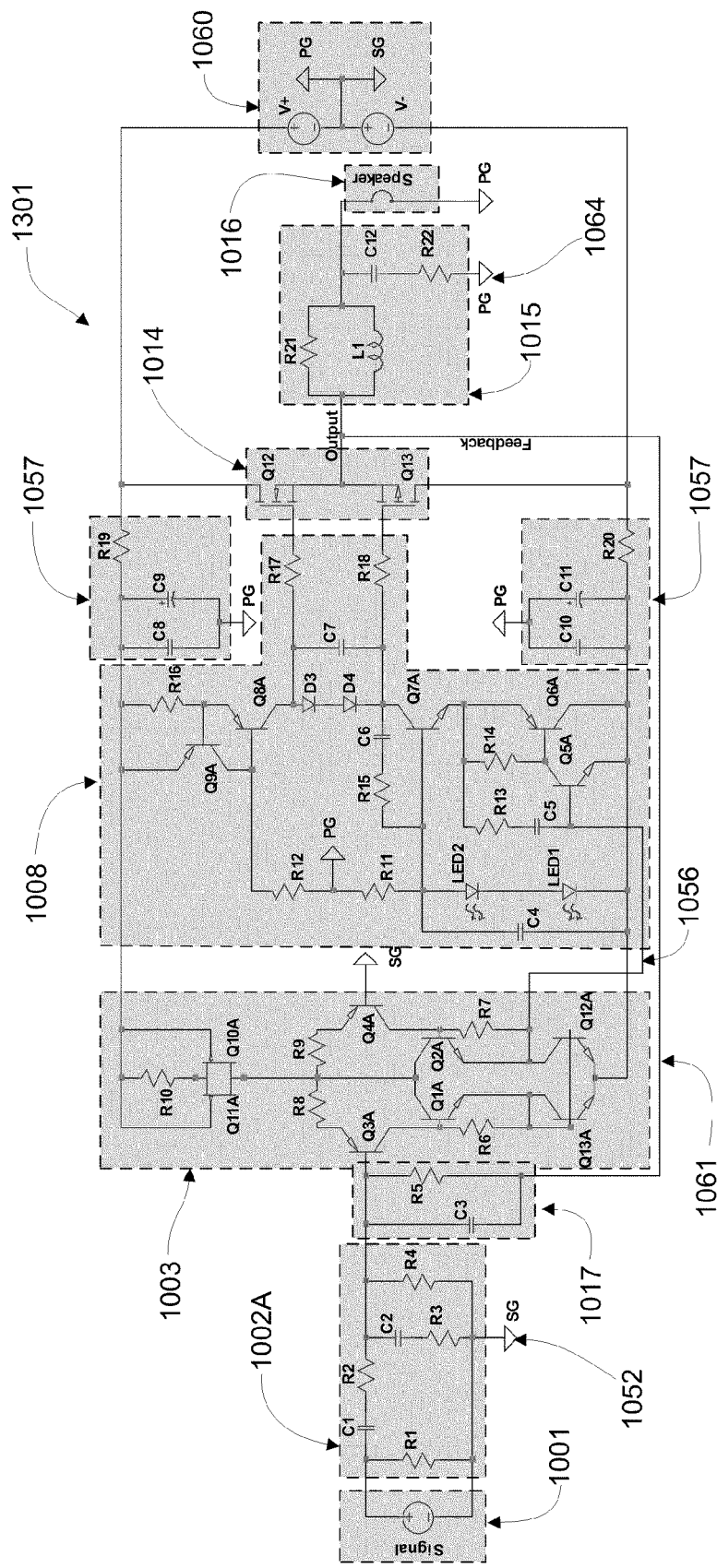
FIG. 23 is a circuit schematic diagram illustrating an example detailed amplifier circuit with unbalanced input filter network.
Figure 24:
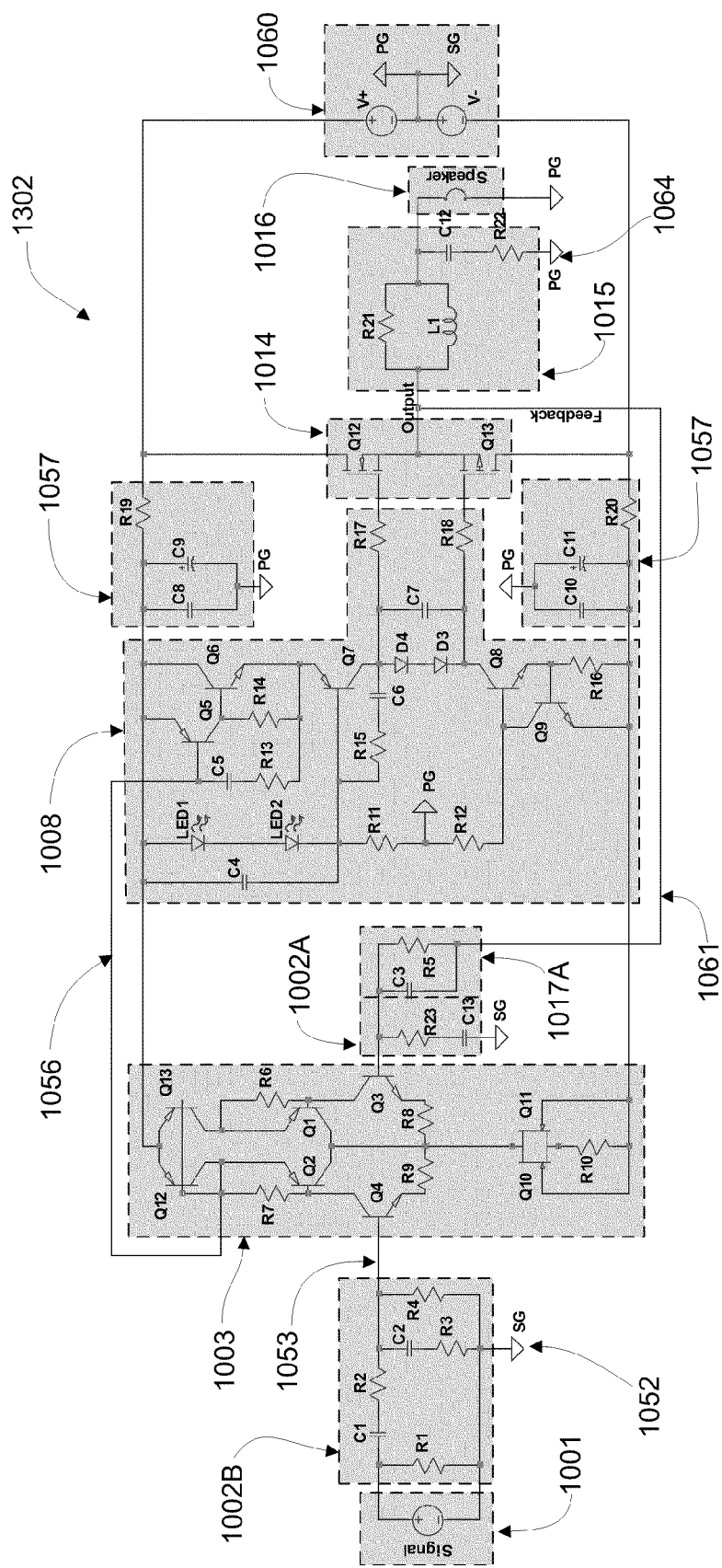
FIG. 24 is a circuit schematic diagram illustrating an example detailed amplifier circuit configured as a non-inverting input amplifier with unbalanced input filter network.
Figure 25:
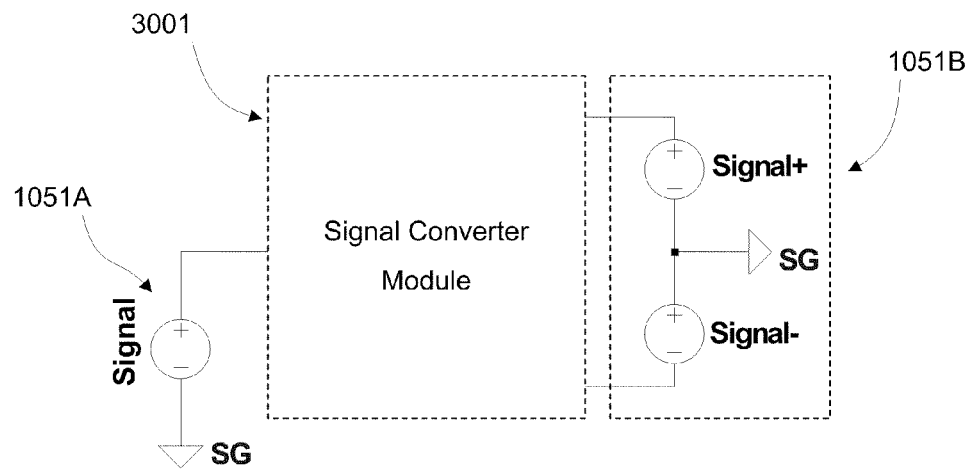
FIG. 25 is a block diagram illustrating a signal conversion module.
Figure 26:
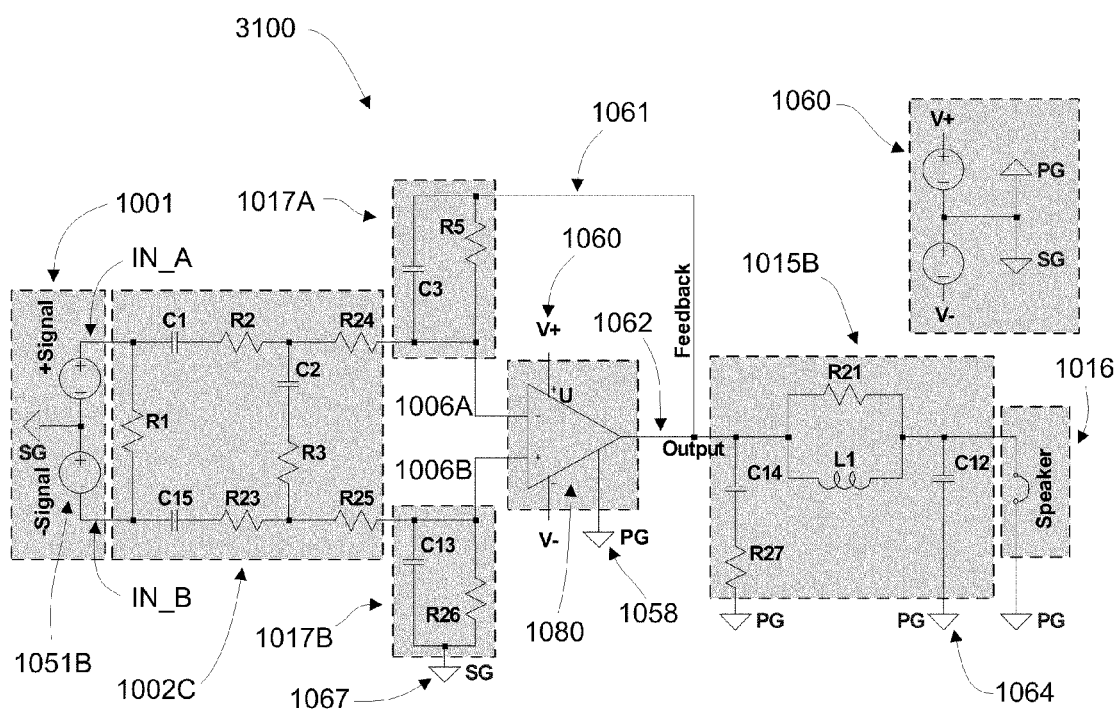
FIG. 26 is a circuit schematic diagram illustrating an example detailed amplifier circuit with balanced input filter network.
Figure 27A:
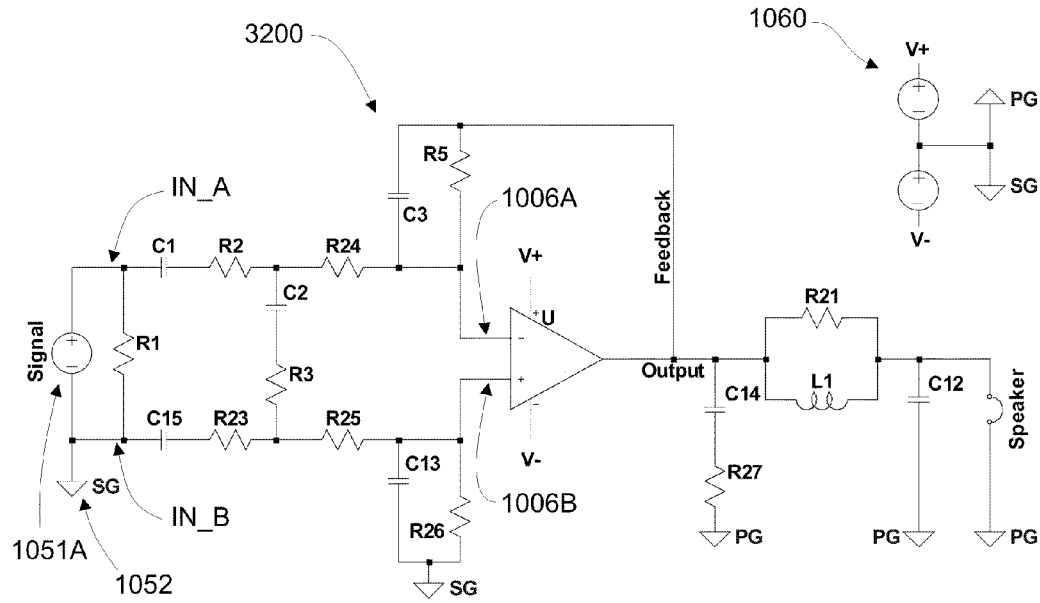
FIG. 27A is a circuit schematic diagram illustrating an example detailed amplifier circuit with balanced input filter network configured with an inverting input.
Figure 27B:
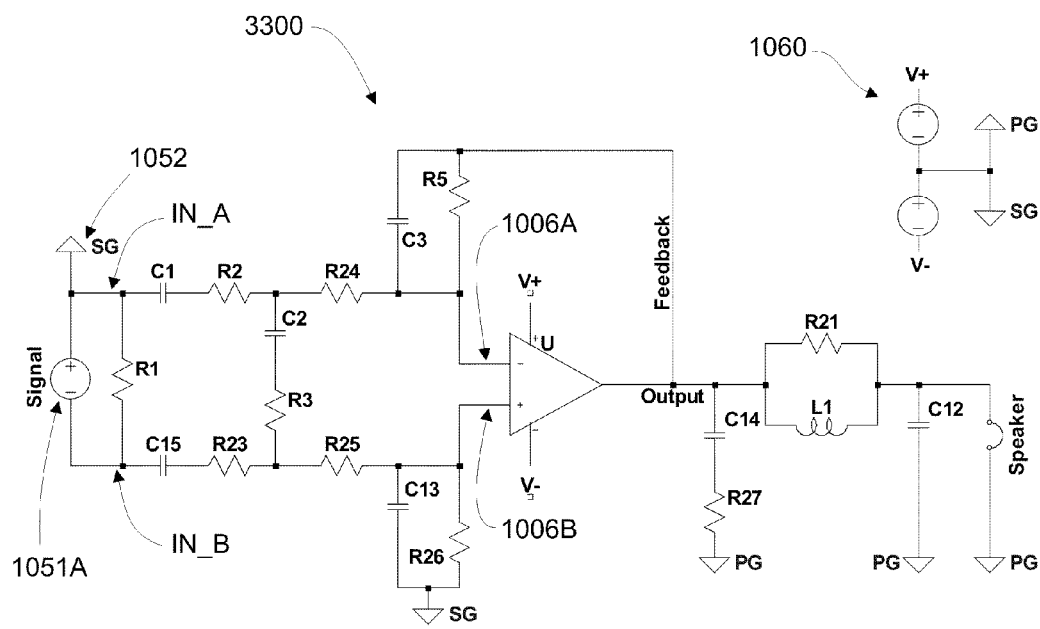
FIG. 27B is a circuit schematic diagram illustrating an example amplifier circuit with balanced input filter network configured with a non-inverting input.

Described embodiments according to FIG. 12 comprise amplifiers with unbalanced input filter network modules, such as exemplified in FIG. 13, FIG. 23, FIG. 24, and amplifiers with balanced input filter network modules, such as illustrated in FIG. 26, FIG. 27A, FIG. 27B and FIG. 28. Amplifiers with an unbalanced input filter network modules may accept unbalanced input signals, and may be configured as either inverting or non-inverting configurations, as illustrated in FIG. 13 and FIG. 24, respectively. Accordingly, an input filter network module 1002 with an unbalanced topology routes an input signal to one or the other of the inverting and non-inverting inputs of a driver stage 1003. Furthermore, amplifiers with a balanced input filter networks module may be configured to accept either a balanced input signal (FIG. 26 and FIG. 28), or an unbalanced input signal in either inverting or non-inverting configurations, as illustrated in FIG. 27A and FIG. 27B, respectively. Accordingly, an input filter network module 1002 with a balanced topology routes an input signal to both the inverting and non-inverting inputs of a driver stage 1003. Moreover, the differences between amplifiers with balanced and unbalanced designs may comprise differences in how a driver stage module 1003, the input filter network module 1002, and the feedback network module 1017 are configured and connected with each other, as discussed herein. A block diagram for converting between unbalanced and balanced signals is illustrated in FIG. 25.

Furthermore, embodiments comprising an amplifier with a balanced input filter network may produce lower distortion and/or noise than embodiments comprising an amplifier with an unbalanced input filter network.

Figure 29:
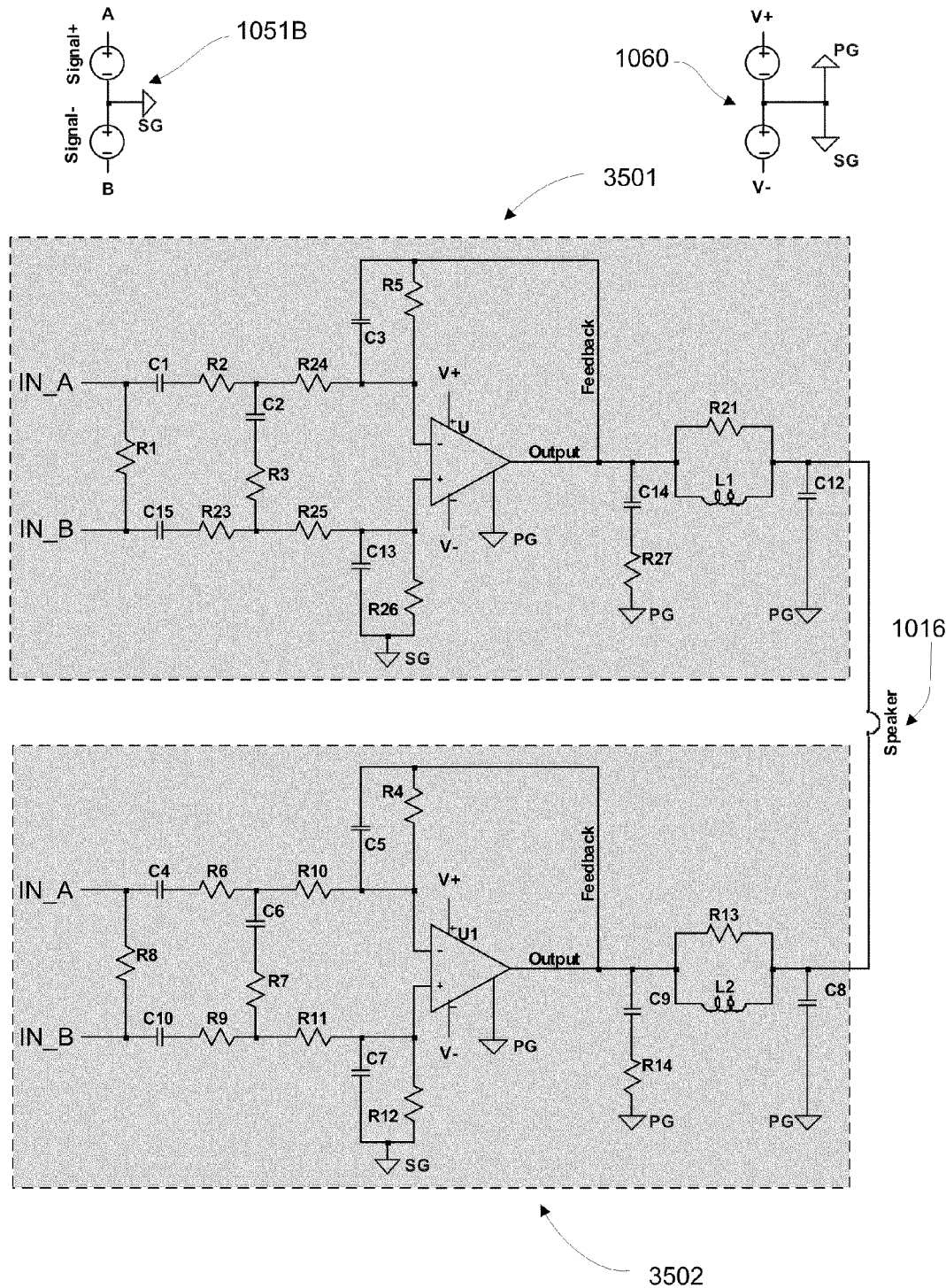
FIG. 29 is a circuit schematic diagram illustrating two amplifiers configured in a bridged mode.

Two amplifier circuits designed according to the block diagram of FIG. 12 may be connected in a bridged mode, to provide a higher output power, as illustrated in FIG. 29 and discussed herein. When two amplifiers are connected in a bridged mode, one of them may work as an inverting amplifier and the other one as a non-inverting amplifier.

Figure 31:
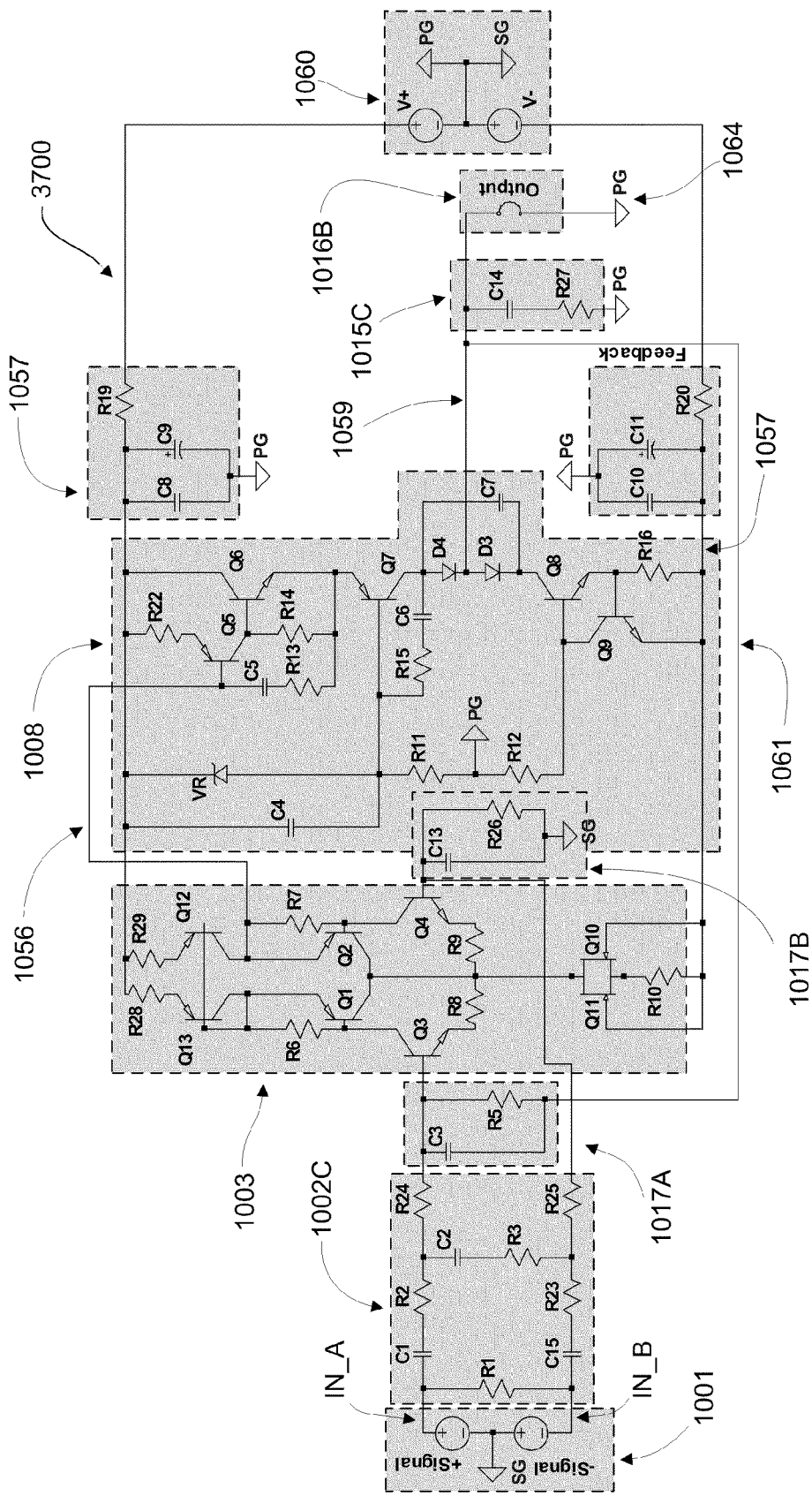
FIG. 31 is a circuit schematic diagram illustrating an example detailed amplifier circuit with balanced input filter network configured as a preamplifier.

Moreover, an amplifier circuit designed according to the block diagram of FIG. 12 may be configurable as a preamplifier, in which case the power transistor module 1014 is optional. When the power transistor module 1014 is not present in the preamplifier circuit, such as illustrated in FIG. 31, output signal 1059 from the VAS 1008 may be connected directly to the output 1062 and feedback 1061. An amplifier circuit may be configurable for use in one or more of a preamplifier or power amplifier circuit for example by including a switch or other mechanism not requiring special tools, which allows the circuit to switch between power amplifier and preamplifier modes. Furthermore, when the power transistor module 1014 is present in the preamplifier circuit, low or medium power transistors may be used in the power transistor module. A preamplifier may comprise any of the aspects of the various amplifier circuits disclosed herein. A preamplifier may generally use lower power supply voltages and currents, and may produce lower output power signals than a power amplifier.

In some embodiments in which the amplifier circuit 1000 is configured as a preamplifier, the output signal interface 1016 may be configured to output a signal 1063 of high impedance. An output signal 1063 of high impedance may be used as an input signal for another module, such as, another amplifier which may optionally also be configured according to FIG. 12.

In some embodiments, amplifier circuits as described herein may be combined with other modules as will be appreciated by those of skill in the art, whether such other modules are known or may be developed. Example other modules include speakers, surround sound processors, optical signal conversion modules, Digital to Analog (D/A) and Analog to Digital (D/A) conversion modules, High Definition Multimedia Interface (HDMI) modules, and Universal Serial Bus (USB) modules.

FIG. 13 is a circuit schematic diagram illustrating an example detailed amplifier circuit 1300 according the general layout of FIG. 12. Amplifier 1300 is configured as an inverting amplifier comprising an unbalanced input filter network module and accepting an unbalanced input signal as described below. Modules of the circuit schematic in FIG. 13 corresponding to modules illustrated in FIG. 12 are indicated using boxes with dashed borders and identifiers corresponding to FIG. 12. Several modules of FIG. 13 are discussed below, and additional modules are discussed in further detail in connection with subsequent figures.

Input signal interface 1001 may include one or more of a signal filter as illustrated in FIG. 1, a signal converter module as described with reference to FIG. 25, a volume control, automatic gain control (AGC), or preamplifier. A preamplifier may comprise an amplifier schematic similar to amplifier 1000. In some embodiments, two circuits according to schematics such as FIG. 12 may be combined, wherein a first circuit serves as a preamplifier and a second circuit serves as a power amplifier.

The unbalanced input filter network module of amplifier circuit 1300 may comprise a first input filter network 1002A, and optionally a second input filter network, not shown in FIG. 13. The first input filter network 1002A may expose a first input, for example, the top wire connecting 1002A with 1001, that is configured to couple to an input signal directly or through the input signal interface 1001, a second input, for example, the bottom wire connecting 1002A with 1001, that is connected to a constant reference voltage, such as ground 1052, and an output providing an output signal 1053 and which is connected to the inverting input of the driver stage 1003, such as the base of transistor Q3. In some embodiments, the non-inverting input of the driver stage 1003, such as the base of transistor Q4, may be connected to a constant reference voltage, such as, the signal ground. Accordingly, a second input filter network may be a wire connecting the non-inverting input of the driver stage 1003, such as the base of transistor Q4, to a constant reference voltage, such as, the signal ground.

The feedback network module of amplifier 1300 may comprise a first feedback network 1017A, and optionally a second feedback network, not shown in FIG. 13. The first feedback network 1017A may expose an input that is connected to the feedback 1061, and an output that is connected to the non-inverting input of the driver stage 1003, such as the base of transistor Q3. In some embodiments, the second feedback network may be implemented as a wire connecting the non-inverting input of the driver stage 1003, such as the base of transistor Q4, to a constant reference voltage, such as, the signal ground.

In some embodiments, a first input filter network 1002A may comprise a high-pass filter and a low pass filter. The high pass filter may comprise for example components C1, R1, and R2. The low pass filter may comprise for example components R2, C2, R3, and R4.

In some embodiments, a first feedback network 1017A may comprise one or more feedback filters made from components such as C3 and R5. The ratio of R5 to R2 may determine or otherwise affect the gain of the amplifier. Feedback 1061 comprises the output signal 1062. Output signal 1062 of an inverting amplifier schematics, such as FIG. 13, may include an inverted and amplified version of the input signal plus any distortion component(s). Output signal 1062 of a non-inverting amplifier schematics, such as FIG. 24, may include a non-inverted and amplified version of the input signal plus any distortion component(s). First feedback network 1017A adjusts the feedback 1061 coming from output 1062, and outputs the adjusted feedback 1066. The adjusted feedback 1066 combines with 1053, ultimately canceling distortion components from the output 1062 and/or 1063 from the amplifier.

Figure 16:
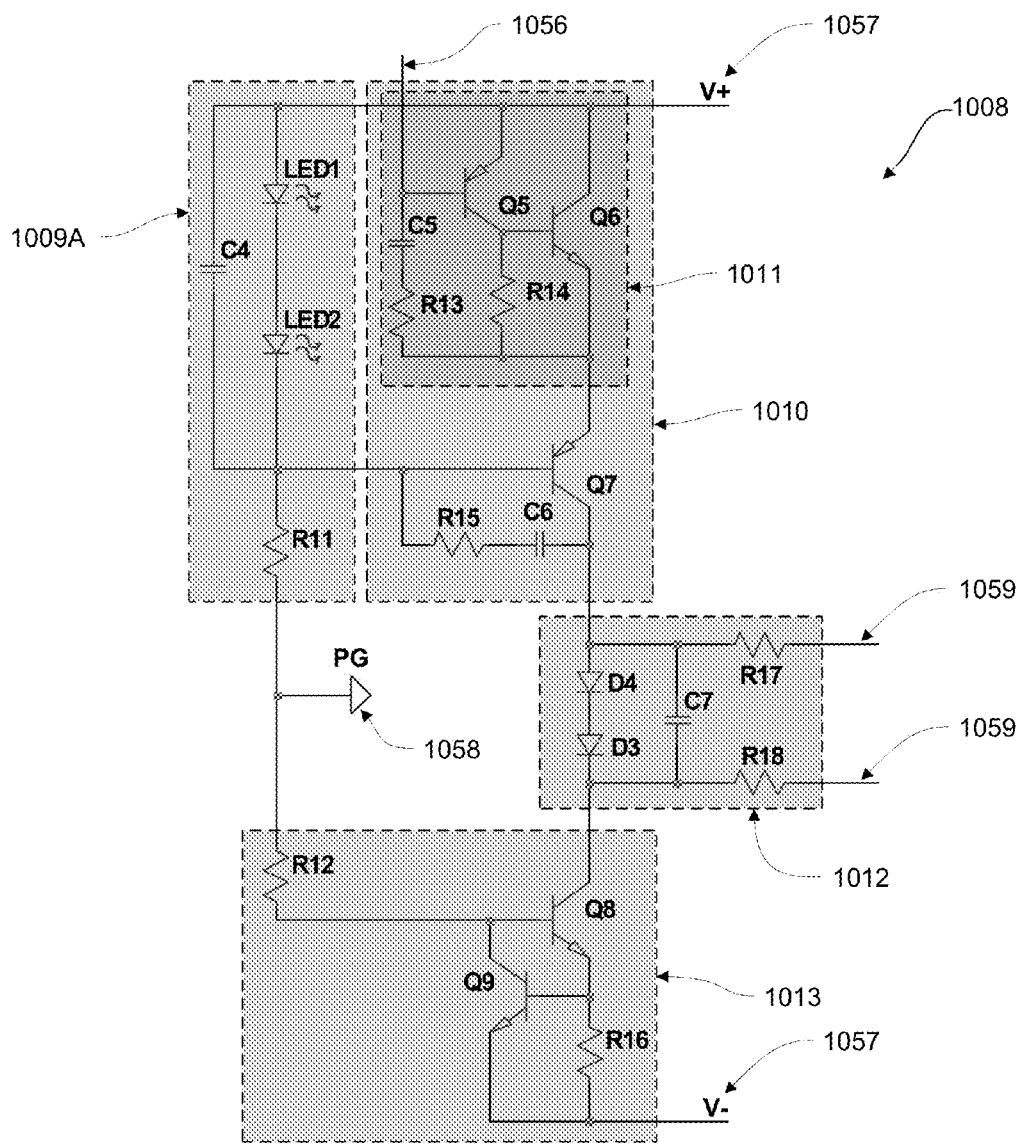
FIG. 16 is a circuit schematic diagram illustrating an example Voltage Amplifier Stage (VAS)
Figure 18:
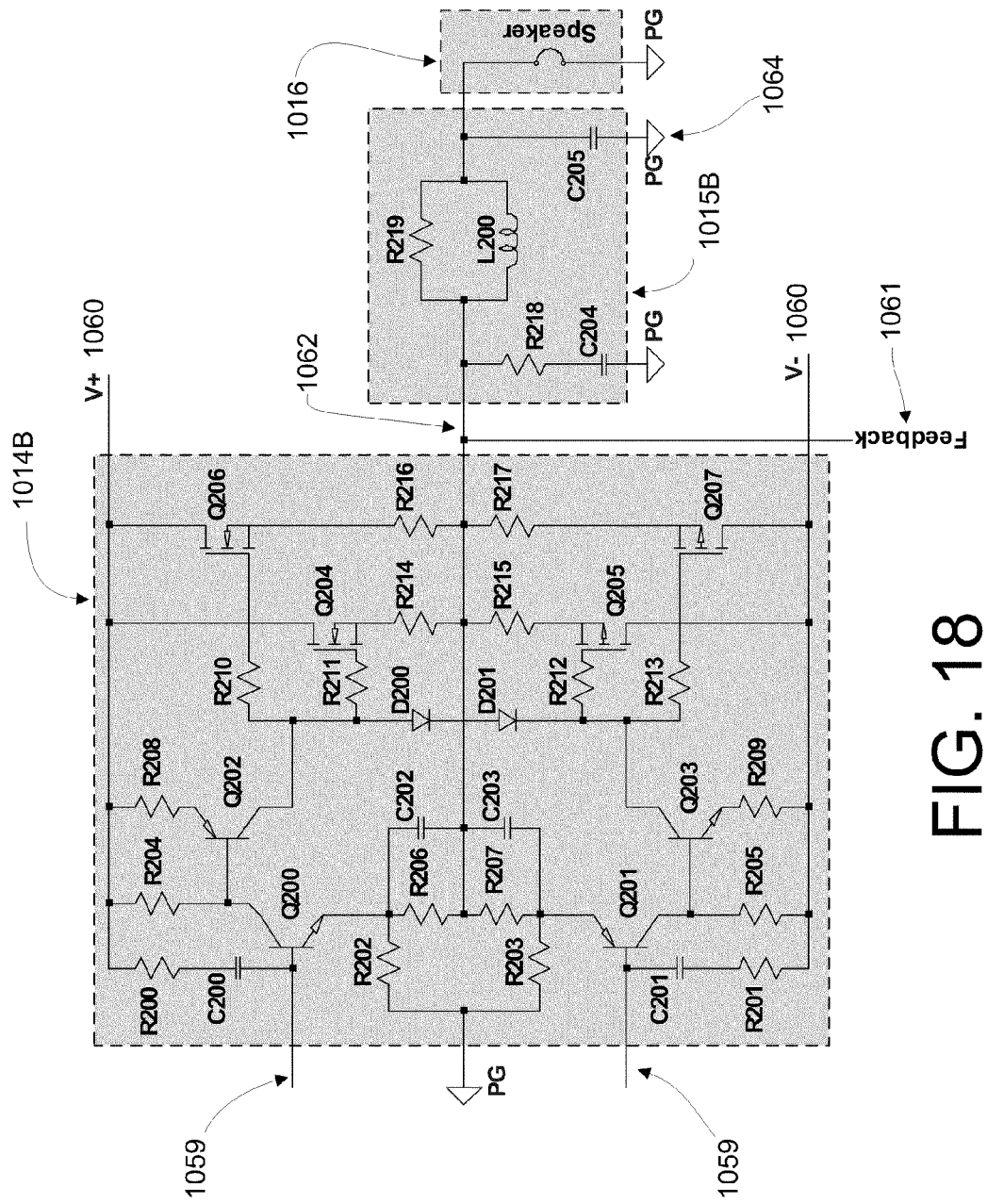
FIG. 18 is a circuit schematic diagram illustrating an example power transistors module.
Figure 19:
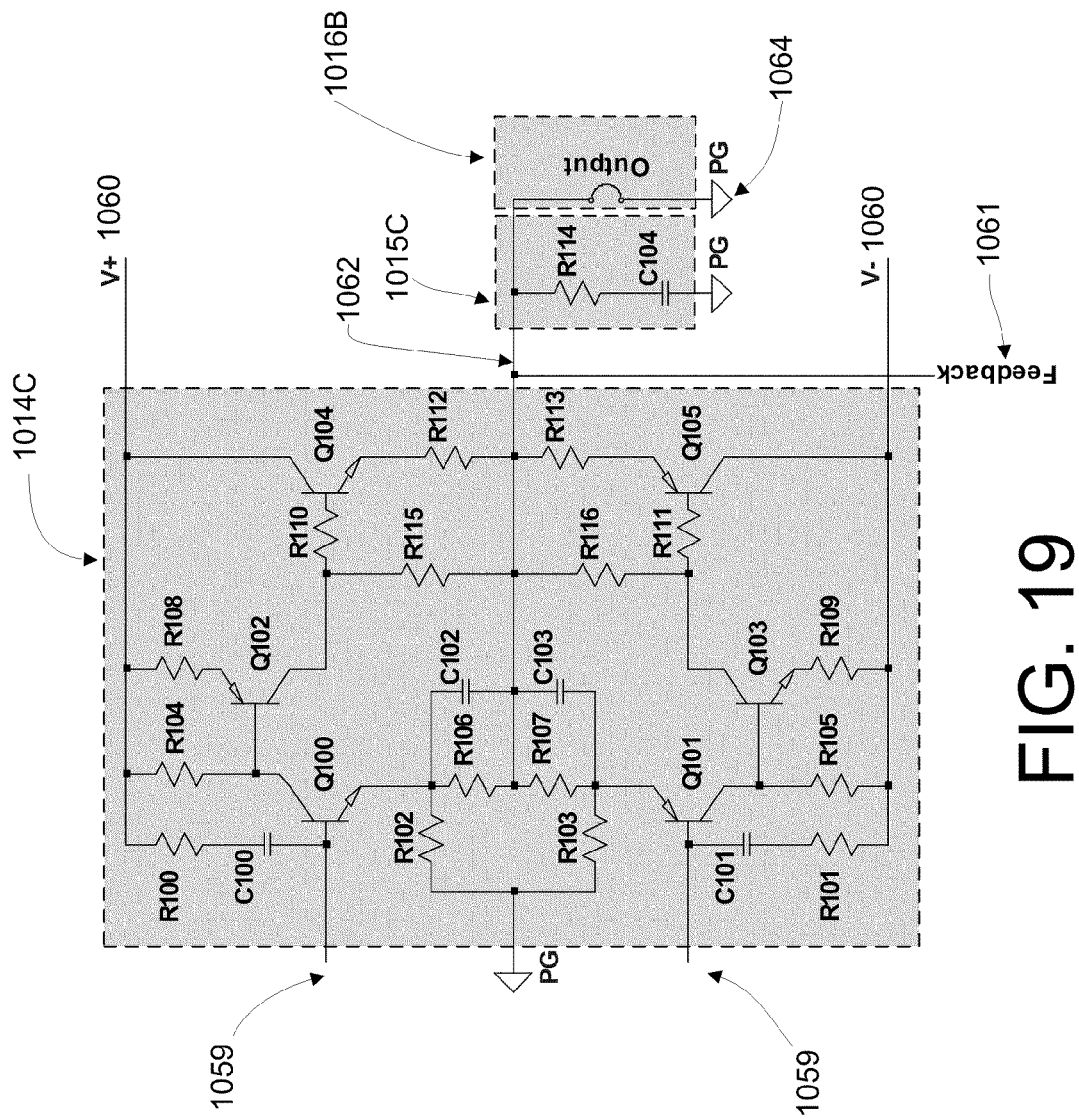
FIG. 19 is a circuit schematic diagram illustrating an example power transistors module.
Figure 21:
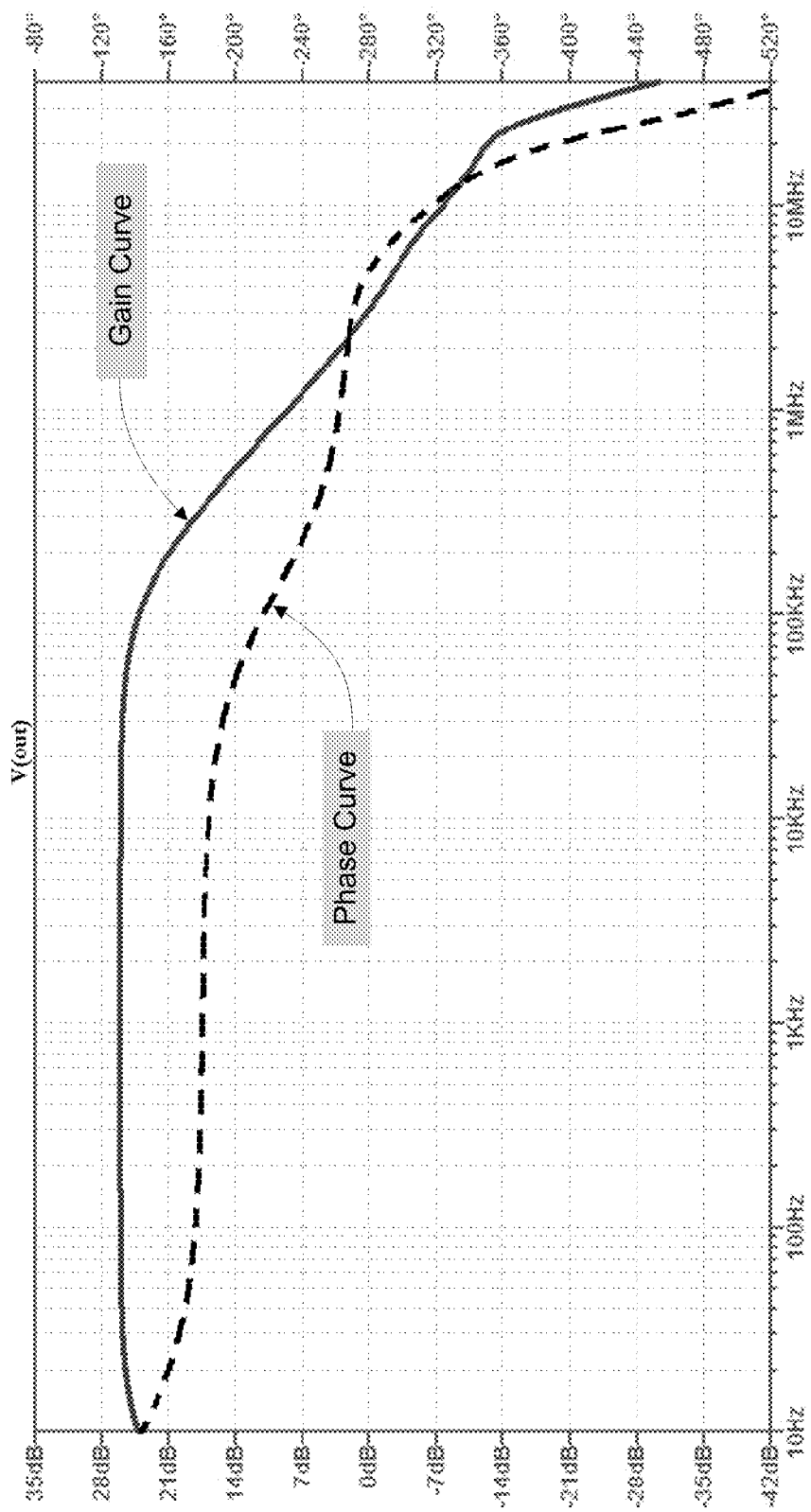
FIG. 21 illustrates an example simulation of gain, shown by the gain curve, and phase difference, shown by the phase curve.
Figure 28:
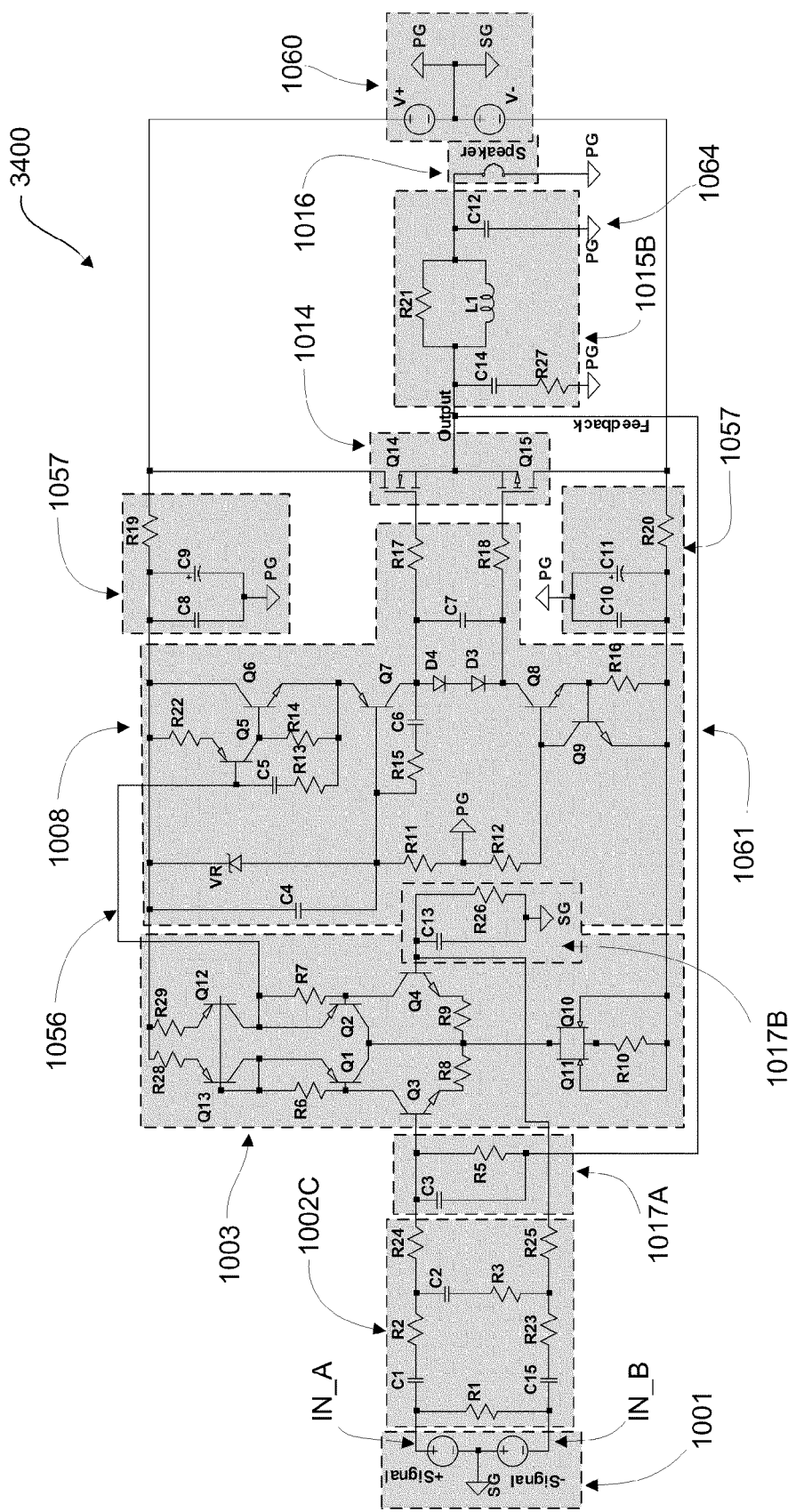
FIG. 28 is a circuit schematic diagram illustrating an example detailed amplifier circuit with balanced input filter network and without the use of an integrated circuit as used in FIG. 26.

In general, referring to FIG. 12, an input filter network module 1002 as well as the various other filters described herein, such as the filter defined in FIG. 13 by R3 and C2, the filter defined in FIG. 13 by R13 and C5, the filter defined in FIG. 13 by R15 and C6, and the filter defined in FIG. 13 by R22 and C12, may comprise a resistor in series with a capacitor. This configuration allows for less phase shift variation of the output signal at the output 1062 and/or 1063 of the amplifier, across input signal frequency ranges that may be encountered by the amplifier. In some embodiments, a feedback network module 1017 may also include a resistor in series with the filter capacitor, such as, C3 in FIG. 13. A resistor in series with a capacitor may be referred to herein as a Series Resistor Capacitor (SRC) filter, or a "custom filter". In addition to FIG. 13, SRC filters are illustrated for example in: FIG. 24 by R3 and C2, and C13 and R23; FIG. 28 by C2 and one or more of R3, R24 and R25; FIGS. 16-17 by C5 and R13 internal to the CFP with filters 1011 and by the filter formed by C6 and R15 internal to the enhanced cascode with filters module 1010; FIG. 18 by filters in the power transistor module 1014, such as the filters defined by C200 and 8200, and C201 and 8201; FIG. 19 by the filters defined by C100 and R100, and C101 and R101. It will be appreciated with the benefit of this disclosure that SRC filters may allow improved control over the gain and phase of signals by providing a custom frequency response that allows for less phase shift variation of the signal at the output 1062 and/or 1063 of the amplifier across input signal frequency ranges that may be encountered by the amplifier. Furthermore, FIG. 13, FIG. 19, FIG. 23, FIG. 24, and FIG. 28 provide examples in which a CFP module 1005 is used in each amplification stage, including driver stage 1003, VAS 1008, and power transistor module 1014. FIGS. 16-17 illustrate a CFP with filters 1011 comprising internal filters which are embedded in an enhanced cascode module with filters module 1010. The filters for the CFP module 1005 within the driver stage 1003, such as the input filter network 1002 and feedback network 1017, are external filters. As illustrated in FIGS. 21-22, with the amplifier circuit described herein it is possible to achieve ultra low distortion by using CFP modules or CFP pairs combined with custom internal or external filters across every amplification stage.

In FIG. 13, a power transistors module 1014 may be configured to provide increased current in an output signal 1062. The illustrated configuration comprises two complementary MOSFET transistors in an emitter follower configuration, one MOSFET for each polarity of the output signal. However, alternative configurations comprising for example bipolar transistors, "quasi-complementary" transistor configurations, or other combinations of transistors may be used in some embodiments. The power transistors module 1014 directly affects the output power of the amplifier by supplying current to the outputs 1062 and/or 1063. Additional power transistors may be used in 1014, e.g., in parallel with Q12 and Q13, to supply additional current in some embodiments, such as illustrated in FIG. 18.

In some embodiments, transistors may be used in parallel in any of the modules listed in FIG. 12. When transistors are used in parallel the total noise induced by the transistors is reduced while total power is increased.

In some embodiments a constant reference voltage, such as, the signal ground (SG) may be connected to another constant reference voltage, such as, the power ground (PG) at the power supply 1060. Also, power supplies 1055, 1057 and 1060 (as illustrated in FIG. 12) may be connected to each other in some embodiments. In FIG. 13, power supply 1057 may be a filtered version of power supply 1060. Power supply 1057 may serve as both power supply 1057 and power supply 1055 illustrated in FIG. 12.

A zobel network and filters module 1015 may be included in some embodiments. The zobel network and filters module 1015 may improve frequency response of the amplifier 1300. The zobel network and filters module 1015 may furthermore improve stability of the amplifier 1300 in response to changes of speaker impedance, e.g., when a speaker is connected or disconnected to output 1063 during operation of the amplifier. The zobel network and filters module 1015 may also attenuate noise that may enter the amplifier at an output signal interface 1016, e.g., when speaker wires act as an antenna to pick up ambient electromagnetic noise, by preventing such noise from combining with feedback 1061. In some embodiments, R21, L1, C12, and R22 may in part serve as a low-pass filter to prevent high frequency noise from entering the amplifier. The zobel network and filters module 1015 may also include a capacitor (not shown) removing any DC voltage from output signal 1063.

Figures 14A, 14B:
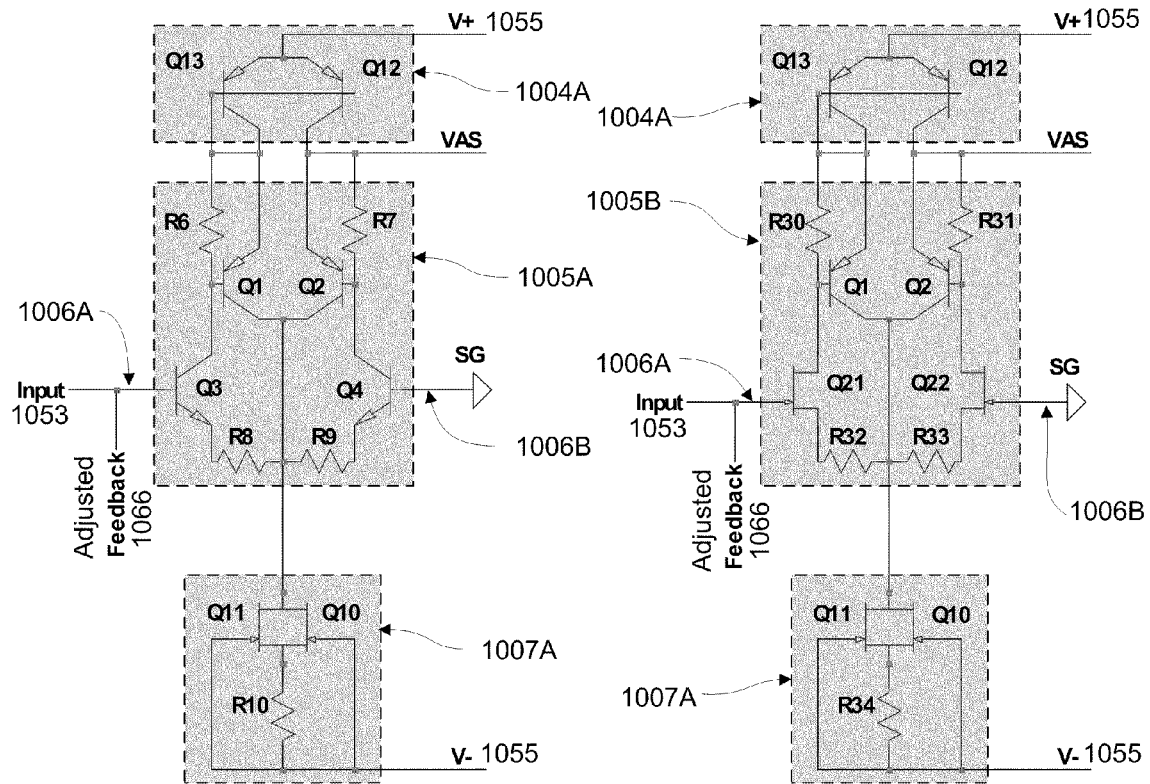

FIGS. 14A, 14B, 14C, and 14D are circuit schematic diagrams, each providing example sub-modules of a driver stage such as 1003. The examples of FIGS. 14A-14D illustrate unbalanced inverting driver stages, however unbalanced non-inverting and/or balanced configurations are also possible, as discussed in connection with FIG. 24 and FIG. 28 respectively. FIGS. 14A-14D demonstrate that multiple driver stage configurations are possible, and embodiments need not be limited to any particular configuration. FIGS. 14A-14D provide a power supply 1055, current mirror modules 1004A and 1004B, inverting inputs 1006A coupled to input 1053 and adjusted feedback 1066, and non-inverting inputs 1006B coupled to a constant reference voltage, such as, signal ground (SG). In some embodiments the non-inverting inputs 1006B of unbalanced inverting driver stages may be connected to a second input filter network, such as, 1002B in FIG. 24. Examples from FIGS. 14A-14D illustrate an embodiment wherein the second input filter network configured to connect to the non-inverting inputs 1006B is a wire. FIGS. 14A and 14D comprise a CFP module 1005A which is a closer view of CFP module as shown in FIG. 13, while FIGS. 14B-14C provide CFP modules 1005B and 1005C, respectively, as additional example configurations for a driver stage. Furthermore, FIG. 14D provides alternative example configurations for mirror module 1004B and constant current module 1007B. In some embodiments, transistors Q12 and Q13 forming current mirror modules 1004A may each have an emitter degeneration resistor, such as R28 and R29 illustrated in FIG. 28.

A CFP module may comprise two CFP configurations. FIGS. 14A and 14D illustrate two example CFP configurations comprising bipolar transistors. A first CFP configuration comprises primary transistor Q1, secondary transistor Q3, biasing resistor R6 and emitter degeneration resistor R8. A second CFP configuration comprises primary bipolar transistors Q2, secondary transistors Q4, biasing resistor R7, and emitter degeneration resistor R9. A secondary transistor, such as Q1, is driven by the current coming from a primary transistor, such as Q3, and passing through the biasing resistor, such as R6. The emitter degeneration resistor, such as R8 and R9 may be optional. In CFP with filters 1011 illustrated in FIG. 17A, the emitter degeneration resistor is not present, while in a similar embodiment shown in FIG. 28, the emitter degeneration resistor, such as R22, is present. Furthermore, in some embodiments the collector of a secondary transistor may be connected directly to the emitter of a primary transistor, while in other embodiments a resistor component may be in connected between the collector of a secondary transistor and the emitter of a primary transistor, as illustrated herein.

In some embodiments, primary transistors are complementary with secondary transistors. Primary transistors may either be of type Negative-Positive-Negative (NPN), such as Q3 or Q4, or may be of type Positive-Negative-Positive (PNP), such as, Q5 of CFP with filters 1011 in FIG. 17A. The secondary transistors may either be of type PNP, such as Q1 or Q2, or may be of type NPN, such as, Q6 of CFP with filters 1011 in FIG. 17A.

In FIG. 14B example CFP module 1005B combines primary Field Effect Transistors (FET) with secondary bipolar transistors. In FIG. 14B, a first CFP configuration comprises FET device Q21, bipolar transistor Q1, biasing resistor R30, and emitter degeneration resistor R32, and a second CFP configuration comprises FET device Q22, bipolar transistor Q2, biasing resistor R31, and emitter degeneration resistor R33. FET devices Q3 and Q4 may be of type "N", while transistors Q1 and Q2 may be of type PNP.

In FIG. 14C example CFP module 1005C combines FETs in both CFP configurations. A first CFP configuration comprises primary FET device Q21, secondary FET device Q23, and emitter degeneration resistor R53, and a second CFP configuration comprises primary FET device Q22, secondary FET device Q24, and emitter degeneration resistor R54. All FET devices in 1005C may for example be of type "N". If the schematic for the amplifier were upturned, the FET devices may for example be of type "P", as described below in connection with FIG. 23. When employing FET devices the biasing resistor is optional.

FIG. 14D illustrates an example simplified current mirror module 1004B which may be used in some embodiments. In FIG. 14D, Q12 and Q13 are replaced with resistors R50 and R51. In alternative embodiments, R50 may be replaced with a wire (instead of a resistor).

FIG. 14D illustrates an example simplified constant current module 1007B which may be used some embodiments. Constant current module 1007B may for example comprise a single resistor R52, without the other components illustrated in constant current module 1007A in FIGS. 14A-14C.

In FIGS. 14A-14D, the value of resistors R8, R9, R32, R33, R53 and R54 may be adjusted to ensure that the amplifier output signal 1063 has a desired DC output voltage, such as zero.

In some embodiments, a CFP configuration may comprise two or more transistors, as illustrated in each of FIGS. 14A-14D. However, a transistor may be replaced in some embodiments with a CFP configuration. Therefore, CFP configurations may be embedded within CFP configurations, to any extent as desired for particular embodiments. Conversely, a CFP configuration can be replaced by a transistor. For example, CFP configuration such as the one from FIG. 14A comprising Q1, Q3, and R6, may be replaced by a single transistor of type "NPN".

Constant current module 1007A in FIG. 14A may comprise a resistor R10, while constant current module 1007A in FIG. 14B may comprises a resistor R34. The values of resistors R10 and R34 may be adjusted to provide an optimal constant current in the driver stage. Similarly, values of resistors R55 and R52 in FIGS. 14C and 14D, respectively, may be adjusted to provide an optimal constant current in the driver stage.

Figure 20:
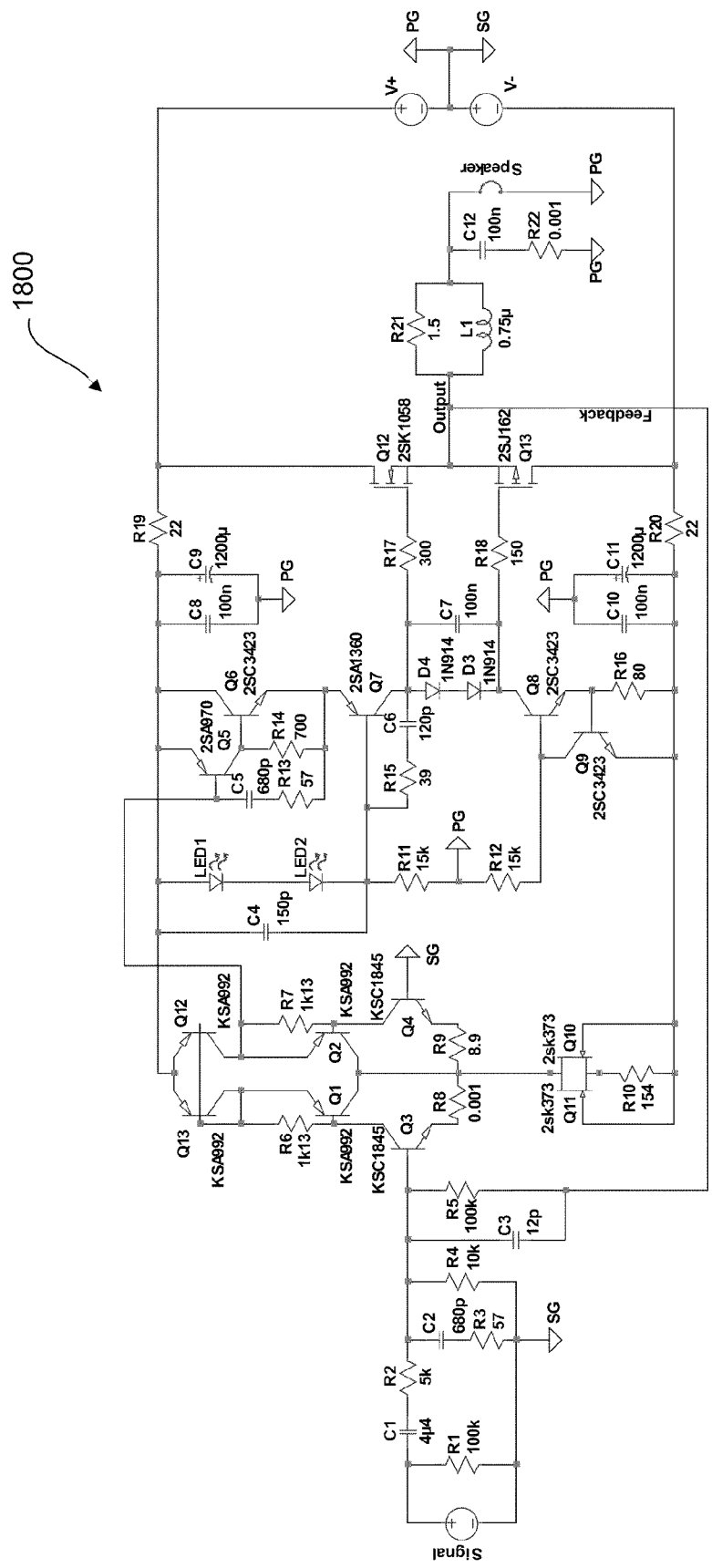
FIG. 20 is a circuit schematic diagram illustrating an example detailed amplifier circuit with unbalanced input filter network.

A schematic such illustrated in FIGS. 13 and 20 may comprise a driver stage according to FIGS. 14A-14D without requiring schematic modifications of the other modules of the schematic layout. For example, a same schematic for VAS 1008 may be used with any of FIGS. 14A-14D. However, components of the schematic of FIGS. 13 and 20 may change in value, in some embodiments, in response to a change from one of the schematics of FIGS. 14A-14D to another of the schematics of FIGS. 14A-14D. For example, modules 1002, 1007, 1010, 1011, 1015, and 1017 may comprise components that may be changed in value in response to a use of the driver stage of FIG. 14A vs. FIG. 14B, 14C, or 14D.

FIGS. 15A, 15B, 15C, 15D, and 15E provide example circuit schematic diagrams for a constant current module 1007. FIGS. 15A, 15B, 15C, 15D, and 15E demonstrate that multiple constant current module configurations are possible, and embodiments need not be limited to any particular configuration. While FIGS. 14A, 14B, and 14C illustrate a module 1007A with two FET components Q11 and Q10 configured as shown, and FIG. 14D illustrates a module 1007B with a single resistor R52 as shown, FIG. 15A comprises a module 1007C with just one FET Q10, FIG. 15B comprises a module 1007D with a depletion mode MOSFET Q20, FIG. 15C comprises a module 1007E with two bipolar transistors Q30 and Q31 configured as shown, FIG. 15D comprises a module 1007F with one bipolar transistor Q32 biased by resistor R57 and two diodes D1 and D2, and FIG. 15E comprises a module 1007G with three bipolar transistors Q33, Q34 and Q35 configured as shown. Module 1007G is an extended version of module 1007E in which bipolar transistor Q31 is replaced by a CFP comprising bipolar transistors Q34, Q35, and resistor component R59. Preferably, the base-emitter biasing voltage of Q33 is higher than the base-emitter biasing voltage of Q35. In FIGS. 15A-15E, resistor components R40, R41, R42, R43, R56, R57, R58, and R60, and diodes D1 and D2 may be selected to accommodate the illustrated configurations to provide a constant current to the driver stage.

FIG. 16 is a circuit schematic diagram illustrating a closer view of a VAS 1008 as shown in FIG. 13. As stated above, VAS 1008 may comprise a reference voltage module 1009, illustrated in FIG. 16 as 1009A, enhanced cascode module with filters module 1010, output transistor bias module 1012, and constant current module 1013. VAS 1008 may receive a signal 1056, and may be connected to a power supply 1057 and a constant reference voltage, such as, power ground (PG) 1058. VAS 1008 may output a signal 1059.

Enhanced cascode module with filters module 1010 may comprise a top transistor Q7 and an embedded CFP with filters 1011, wherein the CFP is used in place of a bottom transistor thereby enhancing amplification linearity of the enhanced cascode with filters module 1010. The top transistor may be biased by a reference voltage module 1009A, and wherein the bottom CFP with filters 1011 may comprise a filter, such as C5 and R13, to improve the stability of the amplifier.

Figures 17A, 17B:
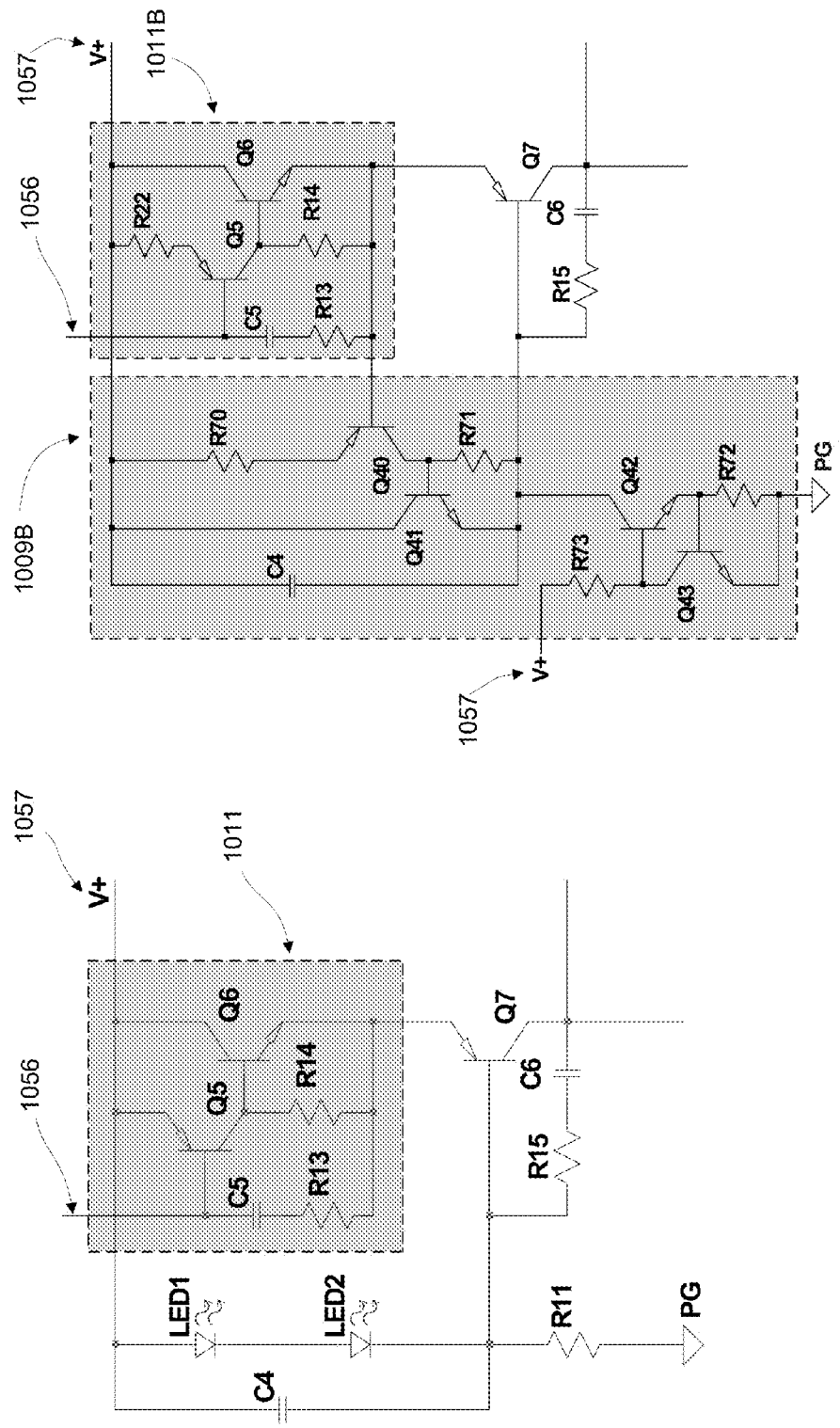
FIG. 17A is a circuit schematic diagram illustrating an example Complementary Feedback Pair (CFP) with filters module.
FIG. 17B is a circuit schematic diagram illustrating an example CFP with filters module and cascode transistor bias module.

FIG. 17A is a circuit schematic diagram illustrating a closer view of a CFP with filters 1011. CFP with filters 1011 may comprise a SRC frequency compensation filter formed for example by C5 and R13. It will be appreciated with the benefit of FIG. 17A that the SRC filter provides custom frequency response for the CFP with filters 1011 contributing to the unconditional stability of the CFP with filters 1011 and the VAS 1008. Also, additional frequency compensation filters may be implemented by C4 and R11, and C6 and R15 providing custom frequency response for the enhanced cascode with filters module 1010 and contributing to unconditional stability of the VAS 1008. The frequency compensation filters may be configured a number of ways. The illustrated frequency compensation filters comprise single pole filters, but configurations with two or more poles are also possible. The combination of the multiple frequency compensation filters produces an effect that may be similar in some respects to multiple pole filters. The frequency compensation filters may attenuate signal gain more at higher frequencies than at lower frequencies. In general, one function of the various filters associated with the amplifier 1000 (including the frequency compensation filter) may attenuate the gain of the amplifier at higher frequencies and ensure that when the amplifier 1000 produces a gain equal to or less than zero dB, the phase difference between the output and input signals is less than 180 degrees. For example, FIG. 21 illustrates an example simulation of gain, shown by the gain curve, and phase difference, shown by the phase curve, which may be achieved by some embodiments of the amplifier, e.g., embodiments corresponding to circuit 1800, illustrated in FIG. 20. It will be appreciated that the filters within the VAS 1008 contribute to unconditional stability of the VAS 1008, and leading to enhanced amplification linearity, improved frequency response of the amplifier and ultra low distortion. The filters may also serve other functions as described herein, and the various other modules with their components may also contribute in some respects to the functions provided by the filters.

In some embodiments, CFP with filters 1011 comprises a primary bipolar transistor Q5 and a secondary bipolar transistor Q6, as shown. Configurations comprising multiple transistors may produce enhanced gain linearity, resulting in lower distortion output signals 1063. In some embodiments, FET or MOSFET transistors may be utilized in place of bipolar transistors, in the CFP with filters 1011, CFP module 1005, and/or any other module or sub-module of the amplifier 1000 and driver stage 1003.

Enhanced cascode with filters module 1010 may be configured with or without resistor R15 and capacitor C6. If R15 and C6 are removed, a value of C5 may be increased to frequency compensate the signal produced by the VAS module 1008. Increasing the value of C5 may overload the CFP with filters 1011 and/or driver stage 1003. Including R15 and C6 may allow for more optimal frequency compensation in some embodiments. An optimal ratio range of C6 to C5 may produce lowest distortion in the amplifier 1300 and create the best stability in case of signal clipping. FIG. 20 illustrates one embodiment of an optimized value for C6 and C5. In some embodiments, optimized values for C6 may comprise up to 150 pico Farad, and optimized values for C5 may comprise up to 3 nano Farad.

In FIG. 16, reference voltage module 1009A may be configured a variety of ways. Reference voltage module 1009A is configured as a constant reference voltage module. The illustrated configuration may bias the transistor Q7 by providing for example a 3.6 volt reference voltage to the base of transistor Q7. Embodiments of module 1009A may be configured to provide any constant reference voltage. LEDs such as LED1 and LED2 may serve as voltage regulation diodes. Zener diodes, voltage regulation integrated or discrete circuits can also be used in some embodiments. A filter may also be included as described above.

Figures 15A, 15B, 15C:
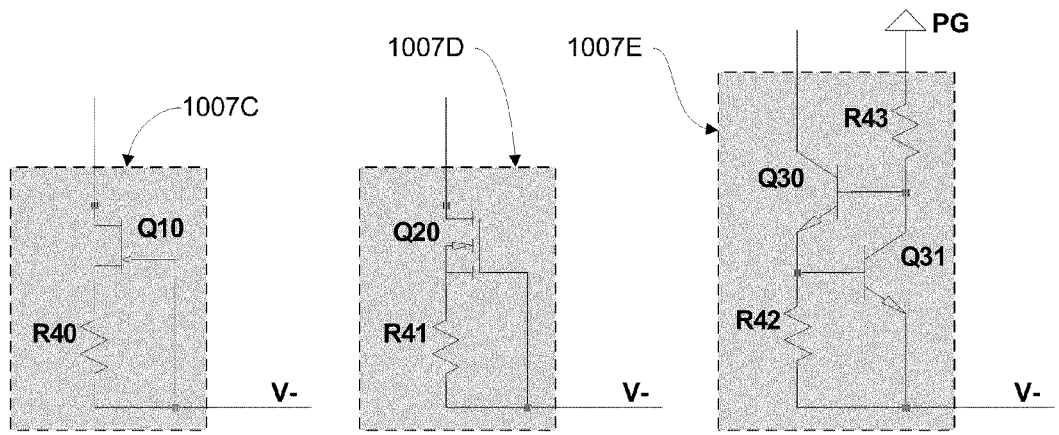

Resistor component R11 and R12 may also serve as current sources for the reference voltage module 1009A and constant current module 1013, respectively. R11 and R12 are similar to the current module 1007B in FIG. 14D. In some embodiments, each of R11 or R12 may be replaced by other types of constant current modules, as discussed in conjunction with FIGS. 14-15. In FIG. 17B resistor component R11 from FIG. 17A has been replaced by a constant current source (VRCS) as illustrated in FIG. 15C, and comprising bipolar transistors Q42 and Q43, and resistor components R72 and R73.

FIG. 17B illustrates an example circuit schematic diagram showing a closer view of a reference voltage module 1009, illustrated in FIG. 17B as 1009B, as may be found in some embodiments. Reference voltage module 1009B is configured as a dynamic reference voltage module. Reference voltage module 1009B comprises a CFP configuration comprising a primary transistor Q40, secondary transistor Q41, biasing resistor R71, and emitter degeneration resistor R70. Preferably, the base-emitter biasing voltage of Q7 is higher than the base-emitter biasing voltage of Q41. As illustrated in FIG. 17B, providing a constant current source VRCS for the reference voltage module 1009B may provide a constant current through the CFP configuration, which will provide a same biasing voltage for transistor Q7 for a large range of power supply voltages 1057. The biasing voltage may be changed by changing the current through the current source VRCS, or by modifying the value of one or more of R70 and/or R71. Furthermore, FIG. 17B also illustrates an example CFP configuration with filters 1011B that may have an emitter degeneration resistor, such as R22.

In some embodiments, as illustrated in FIG. 16, an output transistor bias module 1012 may be configured to create a voltage drop across diodes D3 and D4. An optional capacitor C7 allows Alternating Current (AC) to bypass the diodes D3 and D4, such that a constant bias is produced. In some embodiments diodes D3 and D4 can be replaced by a resistor or a combination of transistor and resistors. Transistor bias module 1012, may also comprise resistors R17, R18 to adjust current of output 1059 as desired for particular embodiments. Output transistor bias module 1012 may be configured in a variety of different ways and this disclosure is not limited to use of an output transistor bias module 1012 configured as shown. Some output transistor bias module embodiments may for example include output signal short-circuit protection for output 1059, 1062 and/or 1063, as may be implemented by certain transistor configurations, and temperature overload protections which may for example turn off or reduce bias in response to high temperatures or high output current in output 1059, 1062 and/or 1063.

In some embodiments, a constant current module 1013 may provide a selected constant current in the VAS 1008. The current may be selected for example by selecting particular values for the various components of the module 1013. Module 1013 may also provide the function of a variable resistor, which automatically varies to ensure constant current in the branch of the circuit comprising Q6, Q7, D4, D3, Q8, and R16. Constant current module 1013 is illustrated in FIG. 16 with a configuration according to FIG. 15C, however constant current module 1013 may be configured for example according to any of FIGS. 15A-15E, described above.

FIG. 18 is a circuit schematic diagram illustrating an example power transistors module. FIG. 18 shows a power transistor module 1014B that combines bipolar transistors with MOSFET power transistors. Power transistor module 1014B may receive signal 1059 via input(s) as illustrated. Inputs 1059 may be coupled with bipolar transistor(s), defined by components of the power transistor module 1014B as described below. Bipolar transistors may be coupled with MOSFET power transistors, defined by components of the power transistor module 1014B as described below. MOSFET power transistors may be coupled with power supply inputs 1060, and may be coupled with a power transistors output 1062. Output 1062 may be coupled with feedback 1061, as described with reference to FIG. 12, and with zobel network and filters configured for example as 1015B. Zobel network and filters 1015B may be coupled with a power ground 1064 and an output interface 1016, as described herein.

FIG. 18 comprises four bipolar transistors, grouped in two CFP configurations with custom filters. A first CFP comprises a first transistor Q200 of type NPN, a second transistor Q202 of type PNP, biasing resistors 8204 and R208, and has a SRC filter comprising C200 and R200. A second CFP comprises a first transistor Q201 of type PNP, a second transistor Q203 of type NPN, biasing resistors R205 and 8209, and has a SRC filter comprising C201 and 8201. In the emitter of Q200 and Q201 there are two symmetrical groups of emitter degeneration resistors with filters. A first group comprises 8202, 8206 and C202. A second group comprises 8203, 8207 and C203. The four bipolar transistors Q200, Q201, Q202 and Q203 (also referred to as the two CFP configurations) may add an extra gain to the signal 1059, and the accompanying filters help in adjusting the frequency response of the signal 1059 in a similar way as the other filters from the VAS do.

FIG. 18 comprises multiple MOSFET power transistors Q204, Q206, Q205 and Q207. The MOSFET power transistors may be configured in two groups, a group for each polarity of the output signal, wherein the MOSFET power transistors within each group are configured in parallel with one another. For example, a first group may comprise Q204 and Q206 in parallel, and a second group may comprise Q205 and Q207 in parallel. This arrangement increases the amount of current going to the output interface 1016. Note that FIG. 13 illustrates a power transistor module with two power transistors, while power transistor module 1014B comprises four power transistors. In general, a power transistor module may comprise any number of power transistors.

FIG. 18 comprises diodes D200 and D201, and resistors R211, 8210, 8212 and 8213. The diodes and resistors may be configured to bias the MOSFETs Q204, Q206, Q205 and Q207, with one resistor for each MOSFET. The diodes and resistors may also serve in part as an additional output transistor bias module 1012. In some embodiments, the diodes can be replaced with other mechanisms configured to bias the MOSFETs, including for example protection circuits. As described above, bias elements may be configured in a variety of different ways and this disclosure is not limited to use of any particular mechanism. Some bias embodiments include short-circuit protection and/or temperature overload protections which may for example turn off or reduce bias in response to high temperatures or high output current.

FIG. 18 comprises a zobel network and filters 1015B configured with elements 8218 and C204, in addition to the elements of the zobel network with filters illustrated in FIG. 13. The SRC filter formed by R218 and C204 allow for additional adjustments of signal phase, and in some embodiments may also improve the "low pass filter behavior" of the zobel network and filters 1015B, and prevent high frequency noise from entering the amplifier.

FIG. 19 is a circuit schematic diagram illustrating an example power transistors module. FIG. 19 illustrates an example power transistor module 1014C that includes bipolar power transistors Q104 and Q105, instead of the MOSFETs as illustrated in FIG. 18. Power transistor module 1014C may receive signal 1059 via input(s) as illustrated. Inputs 1059 may be coupled with bipolar transistor(s), defined by components of the power transistor module 1014C as described below. Bipolar transistors may be coupled with bipolar power transistors Q104 and Q105. Bipolar power transistors Q104 and Q105 may be coupled with power supply inputs 1060, and may be coupled with a power transistors output 1062. Output 1062 may be coupled with feedback 1061, as described with reference to FIG. 12, and with zobel network and filters configured for example as 1015C. Zobel network and filters 1015C may be coupled with a power ground 1064 and an output interface 1016B, as described herein.

FIG. 19 comprises multiple bipolar transistors, Q100, Q101, Q102 and Q103. The bipolar transistors and surrounding components have the same functions as the equivalent components illustrated in FIG. 18.

The bipolar transistors may be configured to couple with bipolar power transistors Q104 and Q105 as shown. In some embodiments, additional bipolar power transistors may be configured in parallel to those illustrated in FIG. 19.

In embodiments according to FIG. 19, the biasing of the bipolar power transistors Q104 and Q105 may be slightly different from the biasing circuitry illustrated in FIG. 18. The biasing of Q104 is determined by the values of component resistors R110, R112 and R115, and the biasing of Q105 is determined by the values of component resistors R111, R113 and R116. Furthermore, while in FIG. 18, D200 may be configured to directly connect to D201 without connecting to the horizontal wire passing between D200 and D201 (which is also the output wire), in FIG. 19 R115 may be configured to connect to R116 and further to the output wire. The same applies for D102 and D103. As described above, bias elements may be configured in a variety of different ways and this disclosure is not limited to use of any particular mechanism.

In some embodiments, Q104 and Q105 may be medium power transistors, to configure the schematic of FIG. 19 as a preamplifier with a high impedance output. Zobel network with filters 1015C shows a simpler variant of a zobel network 1015, and may be used with both preamplifier and power amplifier outputs.

FIG. 20 is a circuit schematic diagram illustrating an example detailed amplifier circuit 1800 along with example values for the various components as well as specific component types associated with manufacturer component names. The illustrated values and component types are examples only and it will be appreciated that the disclosure teaches any values and component types that may replace those shown. Also, several manufacturers may provide equivalent component types suitable for use with some embodiments. Component type selection may be based on availability of simulation data as well as electrical, thermal, and power characteristics and/or other desired properties. FIGS. 21 and 22 show simulation results for the circuit 1800 with component values as shown. In some embodiments, a circuit such as circuit 1800 or any of the circuits described herein may be provided as a data file for simulating and further modifying a circuit. The data file may be provided to a software program for simulating and configuring electrical circuits, or may be supplied along with such a software program. Circuit 1800 may be customized through simulations for desired frequency response and/or specific applications.

In FIG. 20, optimized operational current values may comprise, for example, 1.6 to 2 milli amperes through each of the emitters/collectors of Q1 and Q2, and approximately 0.5 milliamps or slightly over through each of the collectors/emitters of Q3 and Q4, which optimized current may be adjusted by changing a value of R10. The current at R10 may for example be between 4.2 to 5 milli amperes. Depending on the maximum desired output voltage at 1059, optimized operational current values may further comprise, for example, between 8 to 20 milli amperes through each of the collector/emitter of Q6 and emitter/collector Q7, diodes D4 and D3, collector/emitter of Q8, and resistor R16, which optimized current may be adjusted by changing a value of R16.

Figure 22A:
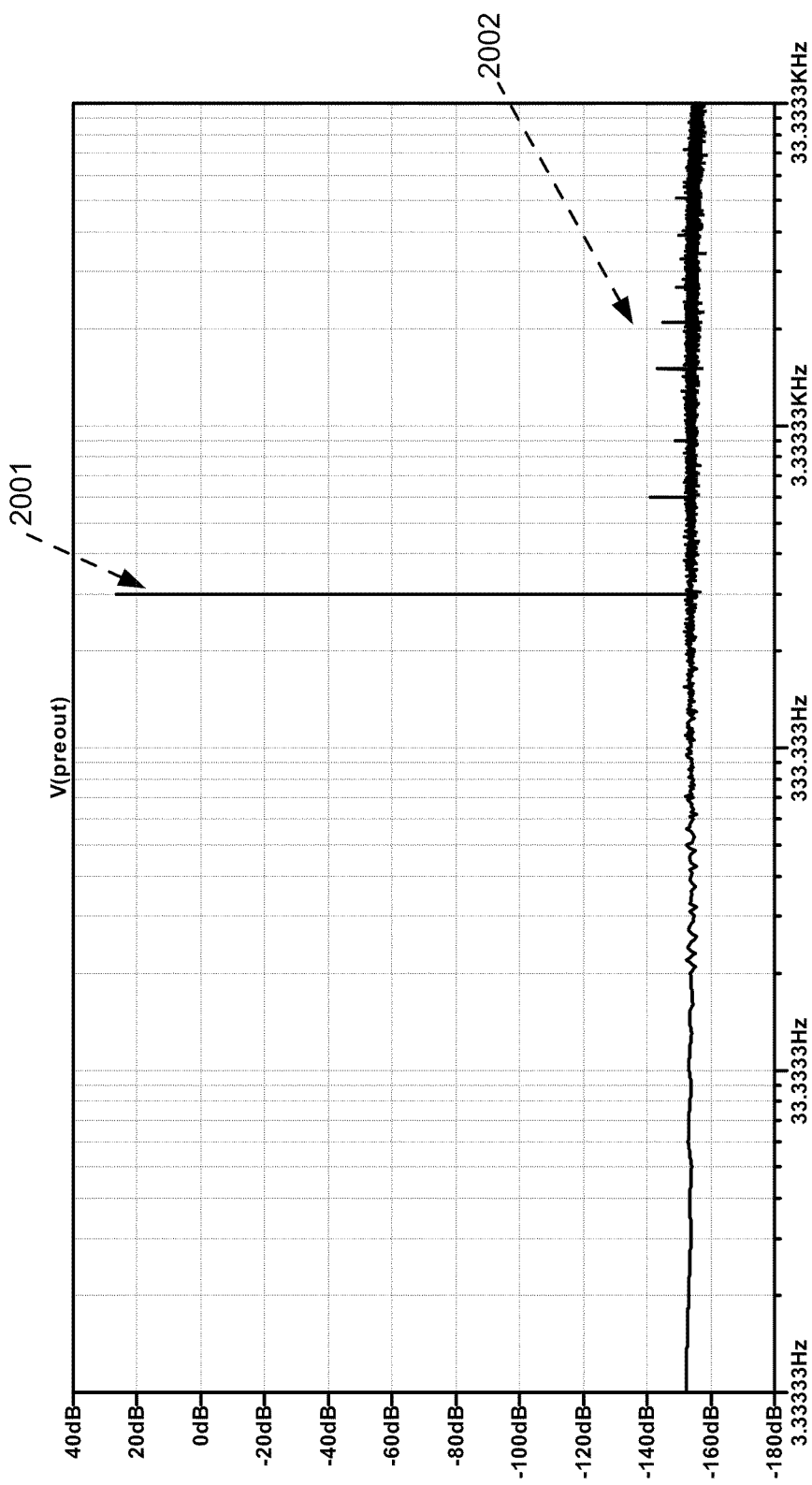
FIG. 22A illustrates a spectrum view of an output signal from an amplifier circuit.
Figure 22B:
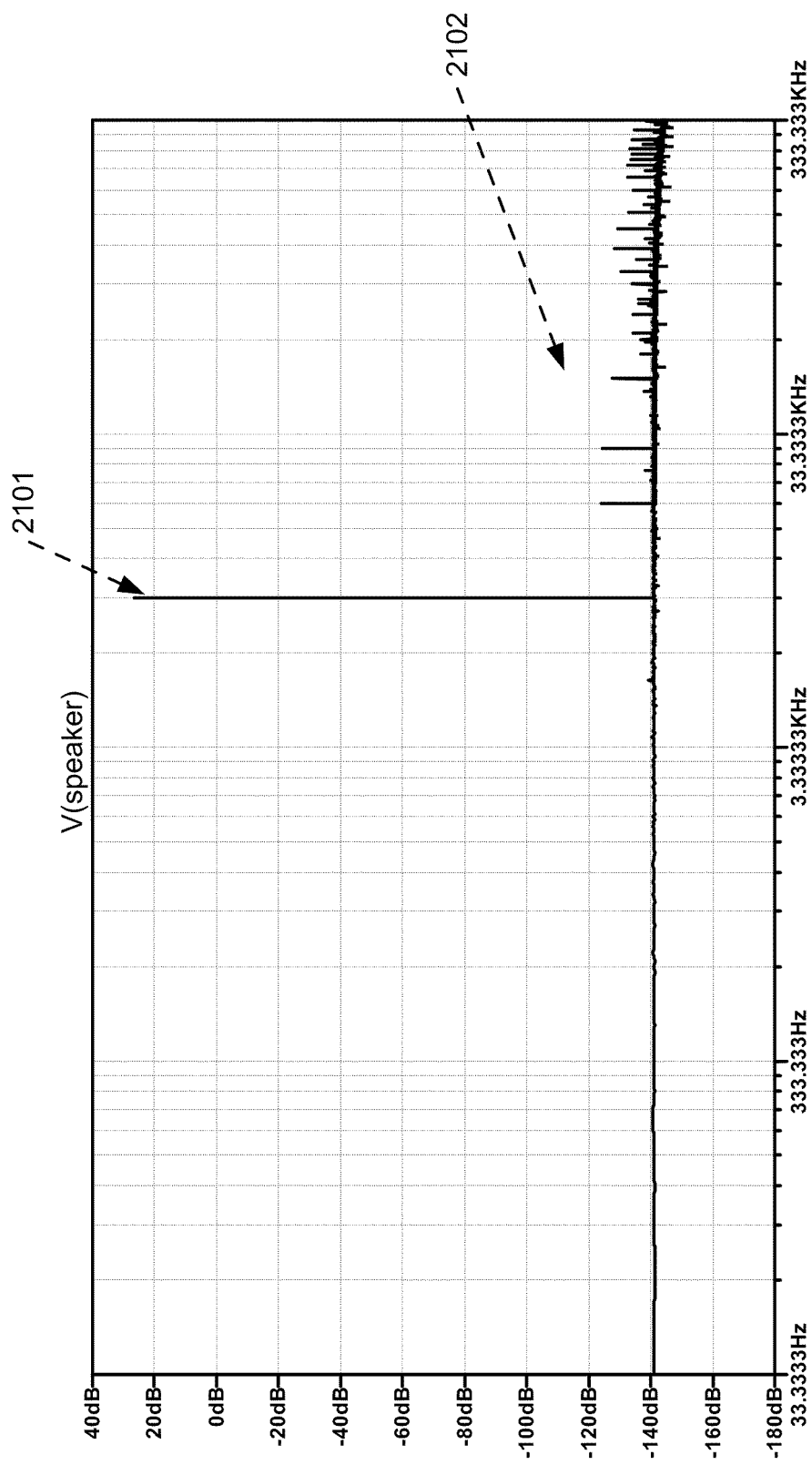
FIG. 22B illustrates a spectrum view of an output signal from an amplifier circuit.

FIGS. 22A, 22B, and 22C show spectrum views of an output signal 1063 of about 30 volts and about 26 dB, respectively, from an amplifier circuit 1800. In FIG. 22A, the input signal 1051 frequency was 1 kHz. The produced output signal 1063 comprises a main component 2001 and several small distortion components 2002. The main component 2001 shows a voltage of about 26 dB, while the largest distortion component from 2002 shows a voltage of about −141 dB. The difference in voltage is therefore about 167 dB for a 1 kHz input, while the output signal 1063 total harmonic distortion is 0.000001%, which can be classified as ultra low distortion. Distortion components 2002 would be even lower for input frequencies below 1 kHz, and the difference between 2001 and 2002 would therefore be even higher.

In FIG. 22B, the input signal 1051 frequency was 10 kHz. The produced output signal 1063 comprises a main component 2101 and several small distortion components 2102. The main component 2101 shows a voltage of about 26 dB, while the largest distortion component from 2102 shows a voltage of about −124 dB. The difference in voltage is therefore about 150 dB for a 10 kHz input, while the output signal 1063 total harmonic distortion is 0.000005%, which can be classified as ultra low distortion.

In FIG. 22C, the input signal 1051 frequency was 20 kHz. The produced output signal 1063 comprises a main component 2201 and several small distortion components 2202. The main component 2201 shows a voltage of about 26 dB, while the largest distortion component from 2202 shows a voltage of about −111 dB. The difference in voltage is therefore about 137 dB for a 20 kHz input, while the output signal 1063 total harmonic distortion is 0.000020%, which can be classified as ultra low distortion.

A circuit such as 1800 is well suited for audio applications and for the transparent amplification of high resolution input signals. A high-resolution input signal, as defined herein, includes any signal of 24 bit or higher resolution. Transparent amplification, as the term is used here, refers to reproduction and amplification of input signals at signal to noise ratios of 125 dB or higher. As mentioned above, the circuit simulations for circuit 1800 show that distortion for an output signal of 30 volt is less than $3 \times 10^{-5}$%, or 0.00003%, corresponding to a signal to noise ratio of around 135 dB, in the audible range of about 20 Hz to 20 kHz, which can be classified as ultra low distortion. Also, a 30 volt output signal can provide over 50 watts Root Mean Square (RMS) to an 8 ohm speaker, and over 100 watts RMS to a 4 ohm speaker. While such a power level is sufficient for many speaker configurations, the circuit 1800 may produce even more power, e.g., over 1000 watts for an 8 ohm speaker, by increasing power supply voltages for power supplies 1055, 1057, and 1060, and input signal 1051 voltage. The constant current modules 1013 and 1007 will automatically adjust the circuit 1800 to adapt to the increased power supply and/or input signal voltage levels.

While the amplifier circuits disclosed herein are therefore demonstrably suited for audio applications in some embodiments, the disclosed amplifier circuits are not limited to audio applications. The amplifiers disclosed herein may be used with any frequency range. In some embodiments amplifiers disclosed herein may be used in connection with frequencies above the audible range, such as for example the Radio Frequency (RF) range for radio communications. In some embodiments, amplifiers according to this disclosure may comprise precision amplifiers adapted for input signals of a different nature than audio signals, for example input signals associated with scientific or medical applications.

FIG. 23 is a circuit schematic diagram illustrating an example detailed amplifier circuit. The circuit of FIG. 23 is an example alternative configuration of an amplifier circuit according to this disclosure. Furthermore, modules in FIG. 23 with like identifiers to modules disclosed in connection with FIG. 12 illustrate example alternative configurations for such modules according to this disclosure. In FIG. 23, transistors in the driver stage 1003 and VAS module 1008 are replaced with complementary versions. PNP transistors are replaced with NPN transistors, and vice-versa. Transistor identifiers in FIG. 23 correspond to identifiers from FIG. 13, with the addition of "A". For example, transistor Q1A in FIG. 23 is a transistor of type NPN corresponding to transistor Q1 in FIG. 13, of type PNP.

FIG. 24 is a circuit schematic diagram illustrating an example detailed amplifier circuit 1302 comprising an unbalanced input filter network module, accepting an unbalanced input signal and being configured as an non-inverting amplifier. The circuit of FIG. 24 is an example alternative configuration of an amplifier circuit according to this disclosure. Furthermore, modules in FIG. 24 with like identifiers to modules disclosed in connection with FIG. 12 illustrate example alternative configurations for such modules according to this disclosure.

In FIG. 24, driver stage 1003 is configured as a non-inverting driver stage. This may be accomplished for example by rotating the schematic of the driver stage 1003, as illustrated in FIG. 13, 180 degrees around a vertical axis, so that, while the adjusted feedback 1066 still connects to Q3 via a first feedback network 1017A, as shown in FIG. 24, the input signal 1053 connects to the non-inverted input at Q4 via a second input filter network 1002B in FIG. 24, instead of the inverting input at Q3 in FIG. 13. However, Q3 still connects to a first input filter network 1002A, comprising R23 and C13, which connects to a constant reference voltage, such as, the ground, instead of the input signal. In some embodiments, such as the amplifier 1302, a second feedback network is merged with the second input filter network 1002B, wherein the second feedback network and the second input filter network are configured such that a same component or set of components (e.g., the components of 1002B) serves as both the second feedback network and the second input filter network. The ratio R5 to R23 may determine or otherwise affect the gain of the amplifier. Alternatively, embodiments may be configured without a second feedback network.

Due to asymmetrical design constraints of the driver stage 1003, determined by the point from which the output signal 1056 is collected, the impedance of the inverting input may be different from the impedance of the non-inverting input. Accordingly, the components values of the various filter networks may vary from an inverting amplifier, such as the amplifier 1300 from FIG. 13, to a non-inverting amplifier, such as the amplifier 1302 from FIG. 24.

FIG. 25 illustrates a block diagram of a signal converter module 3001 which may convert an unbalanced signal 1051A to a balanced signal 1051B, or perform the opposite. A balanced signal may comprise two identical signals in opposite phase to each other, while an unbalanced signal may comprise a single signal. Various options for configuring the signal converter module 3001 will be appreciated by those of skill in the art.

A circuit, such as illustrated in FIG. 25 may be part of an input signal interface 1001. An input signal interface 1001 may be configured to couple with one or more of the first and second input filter networks, discussed below with reference to FIG. 26. In some embodiments, the input signal interface may be configurable for example via a passive or active switch or computer controlled logic, to output a balanced signal via a first signal output and a second signal output to operate the amplifier circuit in balanced mode. The input signal interface may be configurable to output an unbalanced signal via the first signal output and to connect the second signal output to a constant reference voltage or ground to operate the amplifier circuit in unbalanced inverting mode. The input signal interface may be configurable to output an unbalanced signal via the second signal output and to connect the first signal output to a constant reference voltage or ground to operate the amplifier circuit in unbalanced non-inverting mode.

FIGS. 26-28 illustrate example amplifiers with a balanced input filter network 3100, 3200, 3300, and 3400, respectively, designed according to the block diagram shown in FIG. 12. Amplifiers 3100 and 3400 accept a balanced signal 1051B as input. Amplifier 3200 and 3300 accept an unbalanced signal 1051A as input. Amplifier 3200 is an inverting amplifier, while 3300 is a non-inverting amplifier.

Modules in FIG. 26 and FIG. 28 with like identifiers to modules disclosed in connection with FIG. 12 illustrate example alternative configurations for such modules according to this disclosure. Furthermore, the circuit schematic 3100 in FIG. 26 also comprises component 1080 which symbolizes an integrated circuit (IC) that may comprise a set of the modules from FIG. 12, such as, driver stage 1003, VAS 1008, power transistors 1014, and power supply 1057, and also connections between these modules, such as 1056 and 1059. IC 1080 has connection pins for inverting 1006A and non-inverting 1006B inputs, constant reference voltage, such as, power ground 1058, power supply 1060 and output signal 1062.

Moreover, FIG. 26 and FIG. 28 may show two equivalent circuits. In some embodiments, the schematic of IC 1080 may comprise parts of the schematic of amplifier circuit 3400, such as, the schematic of driver stage 1003, VAS 1008, power transistors 1014, and power supply 1057, and also connections between these modules, such as 1056 and 1059. In some embodiments, the IC may comprise one or more of: the power transistors module; the zobel network and filters module; the first feedback network; the second feedback network; the first input filter network; the second input filter network; the output signal interface; and an input signal interface.

A balanced input filter network 1002, may comprise a first input filter network and a second input filter network that are merged into a single input filter network, as shown. Amplifiers with a balanced input filter network, such as, illustrated in FIGS. 26-28 exhibit two inputs for the input signal, such as, an input IN_A of the first input filter network, and an input IN_B of the second input filter network connecting via the balanced input filter network 1002C to the inverting and non-inverting inputs 1006A and 1006B, respectively. Accordingly, while for an amplifier with an unbalanced input filter network the unbalanced input signal 1051A is passed to only one of the inverting or non-inverting inputs of the IC 1080 or driver stage 1003, for an amplifier with a balanced input filter network the balanced input signal 1051B is passed to both the inverting or non-inverting inputs of the IC 1080 or driver stage 1003. In addition, both the inverting and non-inverting inputs 1006A and 1006B may also connect to a feedback network: inverting input 1006A may connect to a first feedback network 1017A which brings the signal from the output, and non-inverting input 1006B may connect to a second feedback network 1017B which connects to a constant reference voltage, such as, the signal ground. Note that here, the term "feedback network" is used loosely for element 1017B, because 1017B does not actually receive a feedback from the output, but rather uses a constant reference voltage, such as, ground as a reference signal.

In some embodiments, an output of the first feedback network may be coupled to the inverting input of the driver stage and the output of the first input filter network, while an input of the first feedback network may be coupled to at least one of the VAS output, the power transistors module, the zobel network and filters module, and the output signal interface. An output of the second feedback network may be coupled to the non-inverting input of the driver stage and the output of the second input filter network, while an input of the second feedback network may be coupled to a constant reference voltage or ground.

In some embodiments, a balanced input filter network 1002C, such as illustrated in FIGS. 26-28, may have a different schematic than an unbalanced filter network 1002A, as shown. A balanced input filter network 1002C may comprise a combination of a first input filter network and a second input filter network. An input of the first input filter network may be configured to couple to one or more of an input signal, a constant reference voltage, ground, and a first output of a input signal interface. Meanwhile, an input of the second input filter network may be configured to couple to one or more of an input signal, a constant reference voltage, ground, and a second output of an input signal interface. An output of the first input filter network may be configured to couple to the inverting input of the driver stage and to the output of the first feedback network, while an output of the second filter input network may be configured to couple to the non-inverting input of the driver stage and to the output of a second feedback network.

A balanced input filter network 1002C may comprise a high-pass filter and a low pass filter. The high pass filter may comprise for example components R1, C1, R2, C15 and R23. The low pass filter may comprise for example components R2, R23, R24, R25, C2, and R3, wherein C2 and one or more of R2, R3, R23, R24 and R25 form a SRC filter that is part of the external filter of the driver stage 1003. Furthermore, it may be desirable in some embodiments that capacitor C1, resistor R2 and R24 have similar or identical parameters with capacitor C15, resistor R23 and R25, respectively. The term parameter refers to component value, temperature coefficient, and other electrical, magnetic and thermal parameters. The ratio R5/(R2+R24), and the ration of R26/(R23+R25) may determine or otherwise affect the gain of the amplifier.

In some embodiments, the schematic of the first feedback network 1017A at the inverting input 1006A may be identical to the schematic of the second feedback network 1017B at the non-inverting input 1006B. Furthermore, it may be desirable in some embodiments that capacitor C3 and resistor R5 have similar or identical parameters as capacitor C13, and resistor R26, respectively.

FIG. 27A and FIG. 27B illustrate example amplifiers 3200 and 3300 with balanced input filter networks, which are configured to accept an unbalanced input signal 1051A instead of a balanced signal 1051B. Example amplifiers 3200 and 3300 have been designed identical to amplifier 3100, with the difference in how the input signal 1051A is connected (coupled) to the inputs IN_A and IN_B of the balanced input filter network. Amplifier 3100 may be configured to operate in balanced mode when a first polarity of a balanced input signal is coupled to an input of the first input filter network, and when a second polarity of the balanced input signal is coupled to an input of the second input filter network, as discussed above. Amplifier 3200 may be configured to operate in inverting unbalanced mode by connecting an unbalanced input signal 1051A to the input IN_A of the first input filter network, and by connecting the input IN_B of the second input filter network to a constant reference voltage, such as, the signal ground 1052. Amplifier 3300 may be configured to operate in non-inverting unbalanced mode by connecting the input signal 1051A to the input IN_B of the second input filter network, and by connecting the input IN_A of the first input filter network to a constant reference voltage, such as, the signal ground 1052. Thus, as can be understood with reference to FIG. 27, one or more of the driver stage, the VAS, the power transistors module, the zobel network and filters module, the output signal interface, the first and second feedback networks, and the first and second input filter networks may be configured to operate with both balanced and unbalanced input signals without requiring change to their respective schematics or component values. Furthermore, an amplifier circuit may contain a switch in the input interface, allowing for switching between modes comprising unbalanced mode, inverting unbalanced mode, and non-inverting unbalanced mode.

FIG. 28 shows an amplifier circuit 3400 that is equivalent to the example amplifier 3100 illustrated in FIG. 26. Illustrated amplifier 3400 accepts as input a balanced signal 1051B, but can be adapted to accept an unbalanced signal 1051A, by connecting one of the inverting IN_A or non-inverting IN_B inputs to a constant reference voltage, such as, the signal ground, as explained in conjunction with FIG. 27A and FIG. 27B. Furthermore, amplifier circuit 3400 exhibits some example configurations for the driver stage 1003 and VAS 1008, and zobel network and filters 1015B. Transistors Q12 and Q13 forming current mirror modules 1004A (FIG. 14A) may each have a resistor in the emitter, such as R28 and R29. The voltage reference module 1009 (FIG. 16) within the VAS 1008 biasing transistor Q7 has been configured with a zener diode or an integrated circuit, which may provide 4V reference voltage to the base of transistor Q7. The CFP configuration 1011B (FIG. 14B) within the VAS 1008 may have an emitter degeneration resistor, such as R22. Zobel network and filters 1015B may comprise an additional low-pass filter, such as, C14 and R27.

FIG. 29 illustrates two amplifier schematics 3501 and 3502, that may be similar to schematic 3100, and which are connected in a bridged mode. Both amplifiers 3501 and 3502 receive as input a same input signal 1051B, yet the signal input to amplifier 3501 is in opposite phase than the signal input to amplifier 3502. Namely, output point "A" of the input signal 1051B is connected to input IN_A of amplifier 3501 and to input IN_B of amplifier 3502, and output point "B" of the input signal 1051B is connected to input IN_B of amplifier 3501 and to input IN_A of amplifier 3502. Moreover, the output signal interface 1016 is connected between the outputs of the two amplifiers in bridged mode, such as 3501 and 3502. Accordingly, the output power of two amplifiers in bridged mode may be 4 times the power of each amplifier when run individually.

Figure 30:
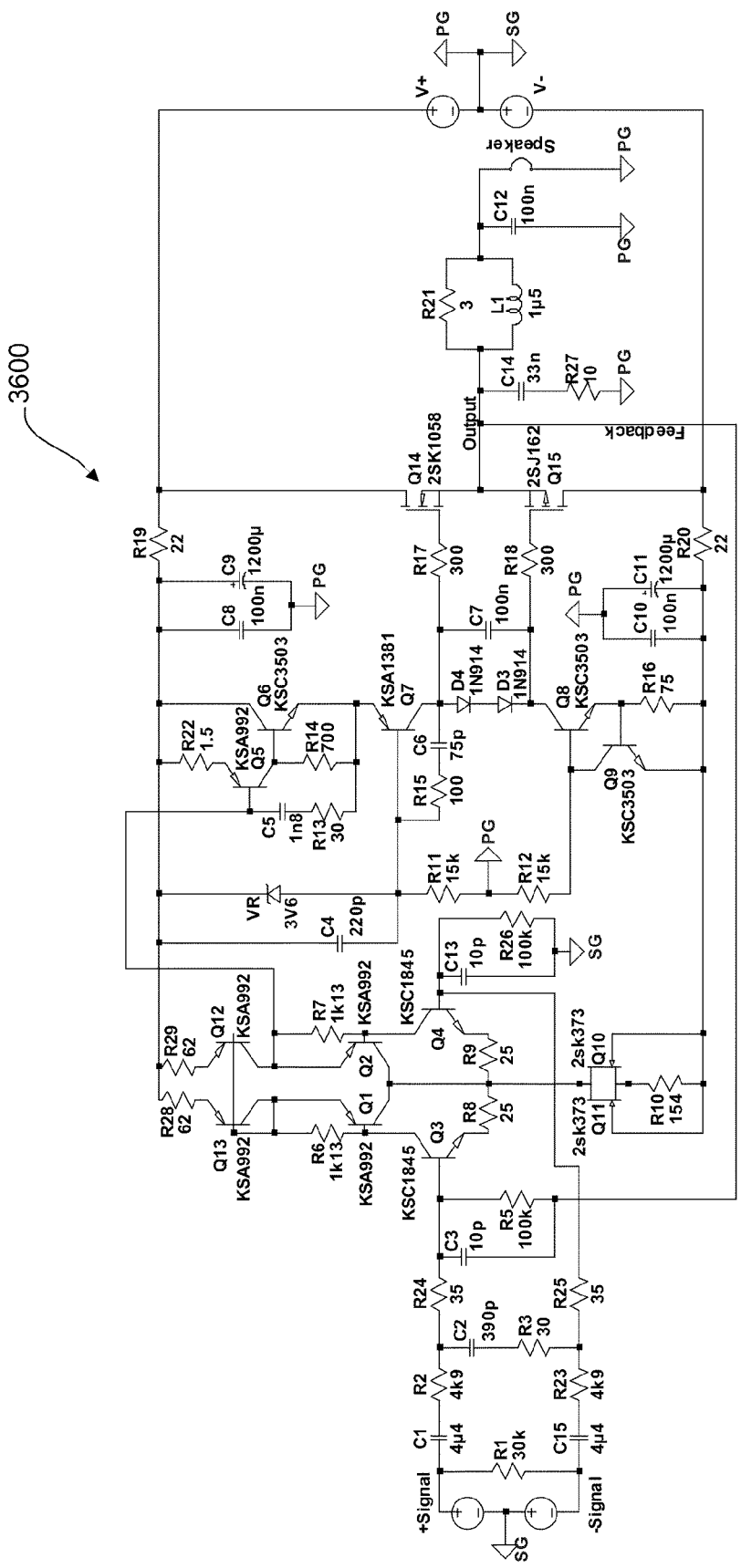
FIG. 30 is a circuit schematic diagram illustrating an example amplifier circuit which is detailed embodiment of the amplifier circuit illustrated in FIG. 28.

FIG. 30 is a circuit schematic diagram illustrating an example amplifier circuit 3600 which is an example detailed embodiment of the amplifier circuit 3100 illustrated in FIG. 28. FIG. 30 includes example values for the various components as well as specific component types associated with manufacturer component names, as will be understood by those of skill in the art. The illustrated values and component types are examples only and it will be appreciated that the disclosure teaches any values and component types that may replace those shown. Also, several manufacturers may provide equivalent component types suitable for use with some embodiments. Component type selection may be based on availability of simulation data as well as electrical, thermal, and power characteristics and/or other desired properties. Circuit 3600 may be customized through simulations for desired frequency response and/or specific applications, as described in connection with circuit 1800 illustrated in FIG. 20.

FIG. 31 is a circuit schematic diagram illustrating an example amplifier circuit 3700 configured as a preamplifier. It will be appreciated that the preamplifier configurations according to FIG. 31 may generally comprise many of the elements illustrated herein in connection with power amplifier configurations, for example, as illustrated in FIG. 12 and/or FIG. 28. Differences between amplifier circuit 3700 and amplifier circuit 3400 from FIG. 28 may include the presence of the power transistor module, which is not present in amplifier circuit 3700, and a different configuration of the zobel network and filters 1015C in amplifier circuit 3700 versus zobel network and filters 1015B in amplifier circuit 3400. Amplifier circuit 3700 may comprise a zobel network and filters 1015C, which is similar to the zobel network and filters illustrated in FIG. 19. In some embodiments, the above described differences may be the only differences, and all the other modules of amplifier 3700 may have a same schematic and component values as the corresponding modules of amplifier 3400. In some embodiments, an amplifier circuit may be configured or configurable to switch between configurations such as 3700 and 3400.

In FIG. 31 the output 1059 from the VAS may connect directly to the feedback 1061 and to the zobel network and filters 1015C. The output interface 1016B of amplifier circuit 3700 may have higher impedance than the output interface 1016 of amplifier circuit 3400.

Figure 32:
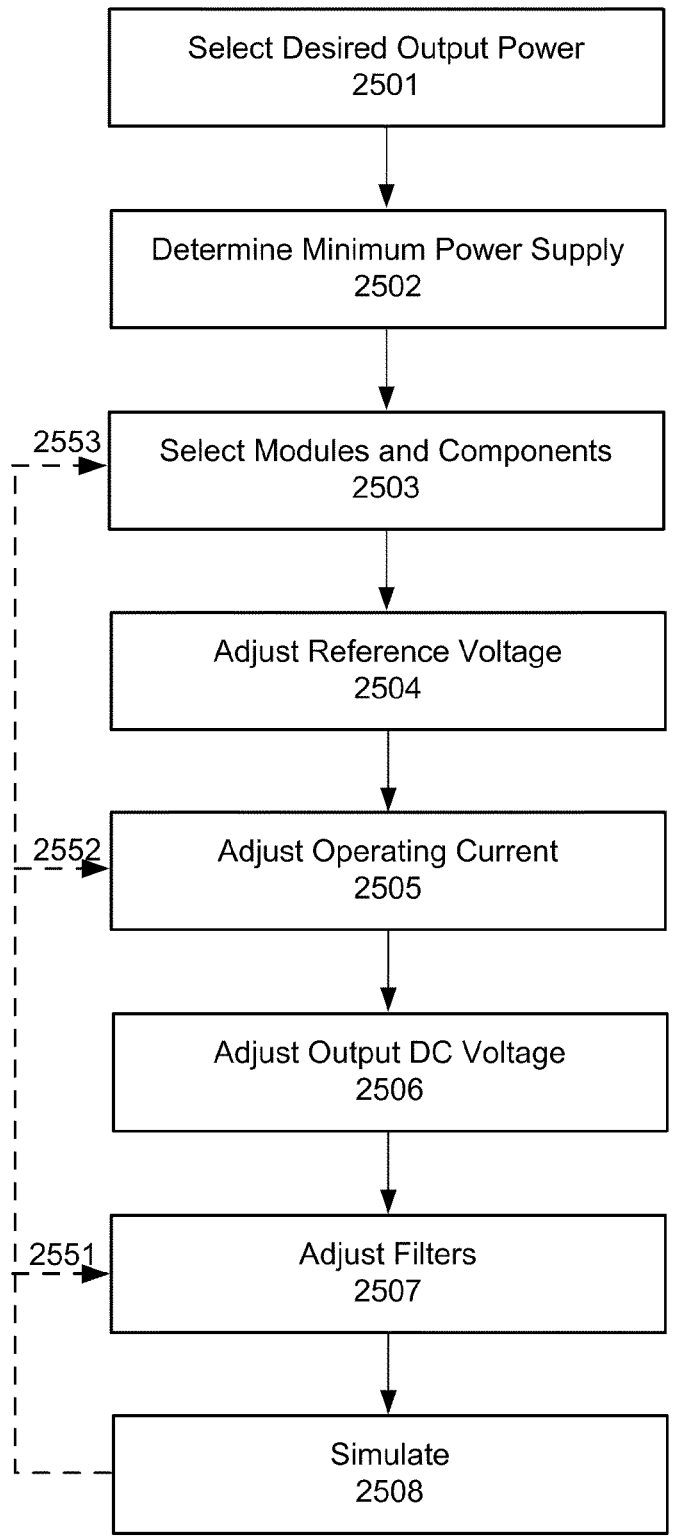
FIG. 32 is as a block diagram illustrating an example process for configuring an amplifier; all arranged in accordance with at least some embodiments of the present disclosure.

FIG. 32 is a block diagram illustrating an example process for configuring an amplifier. An amplifier may for example be configured for a desired gain, frequency response, and distortion level. The process may comprise, for example, a "select desired output power" block 2501, a "determine minimum power supply" block 2502, a "select modules and components" block 2503, an "adjust reference voltage" block 2504, an "adjust operating current" block 2505, an "adjust output DC voltage" block 2506, an "adjust filters" block 2507, and a "simulate" block 2508. The blocks 2501-2508 are illustrated as performed sequentially, however it will be appreciated that certain blocks may be omitted or rearranged in some embodiments. Also, a dotted arrow from block 2508 to blocks 2507, 2505, and 2503 indicates various example iterative processes involving repeating certain blocks as described below.

In a "select desired output power" block 2501, a desired output power may be selected for an output such as 1063. For example, where an amplifier is to be used as an audio amplifier coupled to one or more speakers, an output power level may correspond to a maximum power for the speakers.

In a "determine minimum power supply" block 2502, the output power selected in block 2501 and an impedance of speakers to be driven by the amplifier may be used to determine the minimum power and voltage needed by an amplifier circuit. For example minimum power supplies for power supplies 1055, 1057, and 1060 supplied to a driver stage 1003, a VAS 1008, and/or a power transistors module 1014 may be determined.

In a "select modules and components" block 2503, an overall amplifier schematic may be selected, the overall schematic comprising a set of modules including one or more of modules 1001-1016. Furthermore, in selecting modules 1001-1016, desired modules schematics as well as values for component resistors, capacitors, coils, transistors, diodes, and LEDs may be selected.

In an "adjust reference voltage" block 2504, a reference voltage to be supplied to the amplifier via a reference voltage module such as 1009 may be adjusted. For example, in embodiments comprising LEDs in a voltage module 1009, the number and choice of LEDs, such as LED color choice, may determine reference voltage. LEDs produce little noise and so are desirable in some embodiments. In some embodiments, zener diodes may be used, or an integrated or discrete circuit may be configured to produce a desired reference voltage.

In an "adjust operating current" block 2505, current levels in various modules such as a driver stage 1003, a VAS 1008, and a power transistors module 1014 may be adjusted as described herein. For example, an appropriate resistor may be selected to adjust current in the driver stage 1003 and the VAS 1008, and an output transistor bias module 1012 may be configured to adjust current in the power transistors module 1014.

In an "adjust output DC voltage" block 2506, components within the driver stage 1003, for example values of R8 and R9 in FIG. 13, as well as reference voltages and operating current, described above, may be adjusted to produce a desired DC voltage at an output such as 1063. Adjusting components within the driver stage 1003 may be performed as a primary operation, with adjustment of reference voltages and/or operating current performed as a secondary operation if necessary. In many audio application embodiments, desired DC voltage at an output such as 1063 may be zero. In embodiments where both the transistors and corresponding resistor components from the driver stage 1003 (FIG. 13) are matched in pairs, such as Q3, Q1 and Q13 matched with Q4, Q2 and Q12, respectively, and R8, R6 matched with R9, R7, respectively, the output DC voltage may be close or equal to zero. Additionally, adjusting the value of one of resistor components, such as, R8 or R9 may yield an output DC voltage close or equal to zero. In some embodiments one of R8 or R9 may be replaced by a variable resistor (trimmer). In some embodiments, an additional capacitor may be added, for example in series along a wire carrying an output such as 1062, to block DC signal components while allowing AC signal components to pass through.

In an "adjust filters" block 2507, the circuit comprising the selected modules may then be fine-tuned by adjusting the filter components such as filters in modules 1002, 1005, 1010, 1011, 1015, and 1017, as described above. The various filters associated with amplifier circuits disclosed herein modify frequency response of the circuits. These filters may attenuate the gain of the amplifier at higher frequencies and ensure that when the amplifier produces a gain equal to or less than zero dB, the phase difference between the output and input signals is less than 180 degrees.

In some embodiments, block 2507 may comprise testing the frequency response of the circuit with input signals. The frequency range of input signals supplied to the circuit for testing may be selected. In some embodiments, the input signal frequency range may comprise for example any input frequencies from below audible frequencies (e.g., 1 Hz) to input frequencies at and above those at which the amplifier has a zero dB gain. At an input frequency at which the amplifier has a zero dB gain, output signals may be measured to determine whether a phase difference between the output and input signals is less than 180 degrees, as described above.

Furthermore, frequencies above the audible range may be inspected to determine if the amplifier produces gain peaks. For example, in some embodiments, frequencies above the audible range may be inspected to ensure gains and phases of output signals produced by the amplifier decrease monotonically. Gain curves with non-monotonic gain peaks may be considered undesirable as they may cause undesired oscillations of the amplifier. If such gain peaks are found, filter adjustment may be recommended and/or performed.

In a "simulate" block 2508, the amplifier may be tested using a range of input frequencies to determine distortion caused by the amplifier. In some embodiments, block 2508 may comprise supplying input signals to an amplifier via a signal filter circuit as described herein (FIG. 1). The signal filter circuit may be used to provide low-distortion input signals. Without a "clean" or low distortion input signal, it is difficult to fine-tune an amplifier for minimum distortion. This is especially true when an amplifier produces distortion levels comparable to, or below, that of distortion levels in an input signal used to test the amplifier. Amplifiers according to this disclosure may produce very low distortion. In some embodiments, amplifiers according to this disclosure may produce distortion levels lower than distortions produced by many commercially available signal generators. A signal filter circuit may provide a cost effective approach to testing amplifier circuits using low-distortion input signals.

In FIG. 32, any of blocks 2501-2507 may be repeated after simulate block 2508. For example, a first iterative process may comprise returning one or more times to block 2507 via 2551, to identify filter values corresponding to low output signal 1063 noise and distortion levels, better frequency response, and/or better amplifier stability.

A second iterative process may comprise returning one or more times to block 2505 via 2552, to find optimal operating current corresponding to low output signal 1063 noise and distortion levels within a targeted frequency response band. For each iteration according to 2552, subsequent steps 2506-2508 may also be performed, as well as subsequent iteration(s) according to 2551.

A third iterative process may comprise returning one or more times to block 2503 via 2553, to select different modules and their components for an amplifier circuit configuration, for example, to optimize performance of the circuit as described herein. Various types and brands of transistors and diodes, and various reference voltage levels, may also be interchanged and tested for their effect on output distortion and frequency response. For each iteration according to 2553, subsequent steps 2504-2508 may also be performed, as well as subsequent iteration(s) according to 2551 and 2552.

Any of the processes described herein may be performed at least in part by a computer in some embodiments. For example, an amplifier circuit may be modeled using software, including for example its operating current, power supply voltage, and values for filter components for a desired frequency response, output signal noise and distortion levels. The modeled circuit may be tested using simulated input frequencies, and simulated outputs may be produced, along with graphs such as FIGS. 21-22 and other visualizations of circuit behavior. Appropriately configured software may provide for user interaction via a display and input device(s), allowing the user to reconfigure the circuit by reconfiguring the circuit schematic, module schematics such as a driver stage 1003 schematic or VAS 1008 schematic, and/or values of circuit components.

Furthermore, any or all of the various modules and their components disclosed herein may be provided in an integrated circuit in some embodiments. For example, an integrated circuit may be arranged to comprise one or more of a driver stage 1003 and a VAS 1008. An integrated circuit may be mono-channel or multi-channel. In addition, an integrated circuit may provide other modules for use in conjunction with an amplifier circuit, as will be appreciated by those of skill in the art, whether such other modules are known or as may be developed. Example other modules include surround sound processors, optical signal conversion modules, Digital to Analog (D/A) and Analog to Digital (D/A) conversion modules, High Definition Multimedia Interface (HDMI) modules, and Universal Serial Bus (USB) modules.

In some embodiments, an integrated circuit may be configured with one or more output pins configured for use with a power transistors module such as 1014 that is external to the integrated circuit. The integrated circuit may or may not also include an internal power transistors module. The one or more output pins may allow combining the integrated circuit with any type of external power transistors module, as may be advantageous for providing a desired voltage and current (power) of an output signal such as 1063. An integrated circuit comprising output pins configured for use with an external power transistors module may be used in both preamplifier configurations and power amplifier configurations of any desired output signal voltage and current (power).

In some embodiments, an integrated circuit may be used to provide a first configuration for an amplifier circuit or portion of an amplifier circuit, comprising a first set of component values, e.g., the values illustrated in FIG. 20 or FIG. 30. An integrated circuit may comprise one or more power supply pins, one or more constant reference voltage pins, such as, ground pins, one or more input pins, one or more output pins, one or more control pins, and one or more alternative module/component pins. Power supply pins may connect the integrated circuit to a power supply such as 1055, 1057, and/or 1060. Constant reference voltage pins, such as, ground pins may connect the integrated circuit to a constant reference voltage, such as, power ground 1064 and/or 1058, and optionally also to another constant reference voltage, such as, signal ground 1054 and/or 1052. In some embodiments, the power ground and signal ground may be connected together at the power supply 1060 illustrated in FIG. 12. Input and output pins may connect the integrated circuit to an input signal 1051 and/or provide output signals such as 1059, 1062, and/or 1063. Control pins may connect the integrated circuit to a device configured to control the integrated circuit for example by selecting between modules and components in the first configuration and one or more modules and components as may be available via alternative module/component pins as discussed below.

One or more alternative modules and components may be coupled with the alternative module/component pins of the integrated circuit. The alternative modules and components may provide alternative component values and/or module schematics for certain parts of the first configuration. The first configuration may be modified, for example by a user operating a device configured to interact with the integrated circuit via the control pins, to replace a portion of the first configuration with an alternative configuration by activating an appropriate set of alternative module/component pins.

In principle, any of the modules or components disclosed herein may be exposed through alternative module/component pins, as desired for particular applications. In some embodiments, filters such as the filter defined by C6 and R15 in FIG. 13, components of constant current modules responsible for operating currents (such as R10 from FIG. 13), and a reference voltage module such as 1009 may be beneficially exposed via alternative module/component pins.

In conclusion, a signal filter circuit, an amplifier circuit with balanced or unbalanced input filter networks, combinations thereof and methods for configuring and using the same are provided herein.

Devices, processes, and articles of manufacture according to the present disclosure may be understood by those within the art to be implemented by a wide range of hardware, software, firmware, or virtually any combination thereof. Furthermore, those having skill in the art will recognize that additional modules or components such as a system unit housing, a video display device, a memory such as volatile and non-volatile memory, processors such as microprocessors and digital signal processors, computational entities such as operating systems, drivers, graphical user interfaces, and applications programs, one or more interaction devices, such as a mouse, touch pad, or touch screen, and/or control systems including feedback loops and control motors may be coupled to and used in connection with some embodiments. Therefore, the teachings of this disclosure are not limited to the particular examples disclosed, but should be understood to comprise the full breadth and scope of the appended claims, and equivalents thereof.

The invention claimed is:

1. An amplifier circuit with enhanced amplification linearity, comprising:
a driver stage exposing at least an inverting input and a non-inverting input;
wherein the driver stage comprises a Complementary Feedback Pair (CFP) at the inverting input and a CFP at the non-inverting input;
wherein the driver stage further comprises one or more of a current mirror module, and a constant current module;
wherein the inverting input is configured to couple with a first input filter network and with a first feedback network; and
wherein the non-inverting input is configured to couple with a second input filter network and with a second feedback network; and
a Voltage Amplifier Stage (VAS) coupled to the driver stage, the VAS comprising a different CFP module which is not shared with the driver stage and the VAS exposing at least one VAS output;
wherein the at least one VAS output is configured to couple to one or more of a power transistors module, a zobel network and filters module, and an output signal interface; and
wherein the amplifier circuit is configurable for use in one or more of a preamplifier or power amplifier circuit.

2. The amplifier circuit of claim 1, wherein one or more of the driver stage, the VAS, the power transistors module, the zobel network and filters module, the output signal interface, the first and second feedback networks, and the first and second input filter networks are configured to operate with both balanced and unbalanced input signals without requiring change to their respective schematics or component values.

3. The amplifier circuit of claim 1, further comprising:
the first input filter network wherein:
an input of the first input filter network is configured to couple to one or more of an input signal, a constant reference voltage, and a first output of an input signal interface; and
an output of the first input filter network is configured to couple to the inverting input of the driver stage and to the output of the first feedback network; and the second input filter network wherein:
an input of the second input filter network is configured to couple to one or more of an input signal, a constant reference voltage, and a second output of an input signal interface; and
an output of the second filter input network is configured to couple to the non-inverting input of the driver stage and to the output of the second feedback network.

4. The amplifier circuit of claim 3, wherein the first input filter network and the second input filter network are coupled to each other to provide an input filter network with balanced topology.

5. The amplifier circuit of claim 4, wherein:
the amplifier circuit is configured to operate in balanced mode when a first polarity of a balanced input signal is coupled to the input of the first input filter network, and when a second polarity of the balanced input signal is coupled to the input of the second input filter network;
the amplifier circuit is configured to operate in inverting unbalanced mode when an unbalanced input signal is coupled to an input of the first input filter network, and when the constant reference voltage is coupled to an input of the second input filter network;
the amplifier circuit is configured to operate in non-inverting unbalanced mode when an unbalanced input signal is coupled to an input of the second input filter network, and when the constant reference voltage is coupled to an input of the first input filter network.

6. The amplifier circuit of claim 3, further comprising an input signal interface configured to output a balanced or unbalanced signal, wherein the input signal interface is coupled to one or more of the first and second input filter networks, and wherein:
the input signal interface is configured to output the balanced signal via a first signal output and a second signal output to operate the amplifier circuit in balanced mode;
the input signal interface is configured to output the unbalanced signal via the first signal output and to connect the second signal output to the constant reference voltage to operate the amplifier circuit in unbalanced inverting mode; and
the input signal interface is configured to output the unbalanced signal via the second signal output and to connect the first signal output to the constant reference voltage to operate the amplifier circuit in unbalanced non-inverting mode.

7. The amplifier circuit of claim 1, further comprising:
the power transistors module coupled to the VAS;
the zobel network and filters module coupled to one or more of the VAS and power transistors module; and
the output signal interface coupled to at least one of the VAS, power transistors module, and the zobel network and filters module.

8. The amplifier circuit of claim 7, further comprising:
the first feedback network, wherein:
an output of the first feedback network is coupled to the inverting input of the driver stage and the output of the first input filter network; and
an input of the first feedback network is coupled to at least one of the VAS output, the power transistors module, the zobel network and filters module, and the output signal interface; and
the second feedback network, wherein:
an output of the second feedback network is coupled to the non-inverting input of the driver stage and the output of the second input filter network; and
an input of the second feedback network is coupled to a constant reference voltage.

9. The amplifier circuit of claim 1, further comprising:
the first and second feedback networks; and
the first and second input filter networks;
wherein the second feedback network and the second input filter network are merged such that a same component or set of components serves as both the second feedback network and the second input filter network.

10. The amplifier circuit of claim 9, wherein the amplifier circuit is configured to operate in an inverting unbalanced mode, wherein an unbalanced input signal is coupled to an input of the first input filter network, and wherein the second input filter network and the second feedback network are configured to directly couple the non-inverting input of the driver stage to the constant reference voltage.

11. The amplifier circuit of claim 9, wherein the amplifier circuit is configured to operate in a non-inverting unbalanced mode, wherein an unbalanced input signal is coupled to an input of the second input filter network, and wherein a constant reference voltage is coupled to an input of the first input filter network.

12. The amplifier circuit of claim 1, wherein the VAS further comprises one or more of an output bias module to bias a transistor output, and a constant current module.

13. The amplifier circuit of claim 1, wherein the VAS comprises an enhanced cascode module with filters, and wherein the enhanced cascode module with filters comprises a transistor and the CFP module, wherein the CFP module in the enhanced cascode module is configured to enhance amplification linearity of the enhanced cascode module, wherein the transistor is biased by a reference voltage module, and wherein the CFP module in the enhanced cascode module comprises a filter to improve the stability of the amplifier.

14. The amplifier circuit of claim 13, wherein the reference voltage module comprises either a constant reference voltage module or a dynamic reference voltage module.

15. The amplifier circuit of claim 14, wherein the reference voltage module comprises the dynamic reference voltage module and wherein the dynamic reference voltage module comprises a CFP.

16. The amplifier circuit of claim 1, wherein the driver stage and the VAS are implemented within an integrated circuit (IC).

17. The amplifier circuit of claim 16, wherein the IC exposes one or more of:
- a power supply pin;
- a ground pin;
- input pin(s) comprising one or more of:
  - a driver stage inverting input pin; and
  - a driver stage non-inverting input pin;
- an output pin.

18. The amplifier circuit of claim 16, wherein the IC further comprises one or more of:
- the power transistors module;
- the zobel network and filters module;
- the first feedback network;
- the second feedback network;
- the first input filter network;
- the second input filter network;
- the output signal interface; and
- an input signal interface.

19. The amplifier circuit of claim 1, further comprising at least one custom SRC filter internal or external to each of the driver stage and VAS amplification stages, wherein each of the driver stage and VAS amplification stages has at least one separate custom SRC filter, and wherein each of the custom SRC filters is configured to produce a custom frequency response to unconditionally stabilize each of the CFPs and amplification stages.

20. An amplifier circuit with enhanced amplification linearity and unconditional stability, wherein the amplifier circuit is configurable for use in one or more of a preamplifier or power amplifier circuit, comprising:
- a plurality of amplification stages, wherein:
  - at least one of the amplification stages comprises a driver stage exposing at least an inverting input and a non-inverting input, wherein:
    - the driver stage comprises a Complementary Feedback Pair (CFP) module including a CFP at the inverting input and a CFP at the non-inverting input;
    - the inverting input is coupled with a first input filter network and with a first feedback network;
    - the non-inverting input is coupled with a second input filter network and with a second feedback network, wherein:
      - the first and the second input filter networks comprise external filters, each external filter comprising a resistor in series with a capacitor to form a series resistor and capacitor (SRC) filter, wherein the input filter network SRC filters are configured as at least single pole filters providing a custom frequency response to the driver stage;
  - at least one of the amplification stages comprises a Voltage Amplifier Stage (VAS) coupled to the driver stage, wherein the VAS exposes at least one VAS output, and wherein the VAS comprises:
    - a CFP with filter, wherein:
      - the filter in the CFP with filter comprises at least a resistor in series with a capacitor to form a VAS Series Resistor Capacitor (SRC) filter;
      - the VAS SRC filter is connected to the CFP;
      - the VAS SRC filter stabilizes the CFP in the VAS and defines the frequency response of the VAS; and
      - the VAS SRC filter is configured as at least a single pole filter providing custom frequency response;
    - wherein the at least one VAS output is connectable to one or more of a power transistors module, a zobel network and filters module, and an output signal interface;
- wherein the CFPs in each of the driver stage and VAS enhance amplification linearity of the driver stage and VAS; and
- at least one custom SRC filter internal or external to each of the driver stage and VAS amplification stages, wherein each of the driver stage and VAS has at least one separate custom SRC filter, and wherein each of the custom SRC filters is configured to produce a custom frequency response to unconditionally stabilize each of the CFPs and amplification stages.

21. The amplifier circuit of claim 20, wherein the CFP with filters in the VAS is embedded within an enhanced cascode module with filters that comprises:
- a transistor biased by a reference voltage module; and
- a filter internal to the enhanced cascode module with filters configured to stabilize the enhanced cascode module with filters and to define a frequency response of the VAS.

22. The amplifier circuit of claim 20, wherein the CFP in each amplification stage is a different CFP which is not shared with the other amplification stages.

23. The amplifier circuit of claim 20, wherein the second feedback network and the second input filter network are merged such that a same component or set of components serves as both the second feedback network and the second input filter network.

24. The amplifier circuit of claim 23, wherein the second input filter network and the second feedback network are configured to directly couple the non-inverting input of the driver stage to the constant reference voltage.

25. The amplifier circuit of claim 20, wherein the first and second input filter networks in the driver stage are coupled to each other to provide an input filter network with balanced topology.

* * * * *